United States Patent
Fujiwara et al.

(10) Patent No.: US 11,089,186 B2
(45) Date of Patent: Aug. 10, 2021

(54) IMAGE PICKUP APPARATUS EQUIPPED WITH HEAT DISSIPATION MECHANISM

(71) Applicant: CANON KABUSHIKI KAISHA, Tokyo (JP)

(72) Inventors: Yuya Fujiwara, Yokohama (JP); Yoshinobu Shibayama, Kawasaki (JP); Koichi Shigeta, Kawasaki (JP); Masato Ito, Yokohama (JP); Yuya Nagata, Hachioji (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 97 days.

(21) Appl. No.: 16/702,933

(22) Filed: Dec. 4, 2019

(65) Prior Publication Data

US 2020/0204708 A1   Jun. 25, 2020

(30) Foreign Application Priority Data

Dec. 25, 2018 (JP) .............................. JP2018-241271

(51) Int. Cl.
*H04N 5/225* (2006.01)
*H05K 7/20* (2006.01)
*G03B 17/55* (2021.01)

(52) U.S. Cl.
CPC ........... *H04N 5/2252* (2013.01); *G03B 17/55* (2013.01); *H05K 7/20409* (2013.01)

(58) Field of Classification Search
CPC ............. H04N 5/2252; H04N 5/22521; H04N 5/2253; H04N 1/00978; H04N 1/00981; H04N 1/00984; H04N 1/00986; H04N 1/009766; H05K 7/20409; G03B 17/55
See application file for complete search history.

(56) References Cited

U.S. PATENT DOCUMENTS

2004/0114919 A1 * 6/2004 Rife ..................... H04N 5/2252
                                                              396/494

FOREIGN PATENT DOCUMENTS

JP   2009206951 A     9/2009
JP   2015185852 A  * 10/2015

* cited by examiner

*Primary Examiner* — Nelson D. Hernández Hernández
(74) *Attorney, Agent, or Firm* — Rossi, Kimms & McDowell LLP

(57) ABSTRACT

An image pickup apparatus that is capable of efficiently dissipating heat generated in a sensor substrate or a control substrate. An image sensor is implemented on the sensor substrate. A first heat dissipation section has four faces approximately parallel to an optical axis of an image pickup optical system of a lens unit and is fixed to the lens unit so that the four faces will surround the optical system from four sides. The control substrate is thermally coupled with the first heat dissipation section. A second heat dissipation section is arranged at a side opposite to the optical system in an optical axis direction with respect to the sensor substrate and is fixed to the first heat dissipation section. A heat conduction member is arranged between the sensor substrate and the second heat dissipation section in the optical axis direction so as to contact the both.

13 Claims, 15 Drawing Sheets

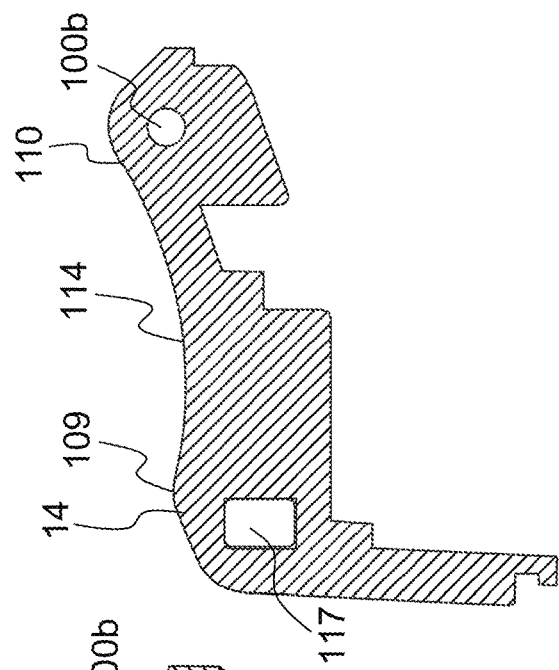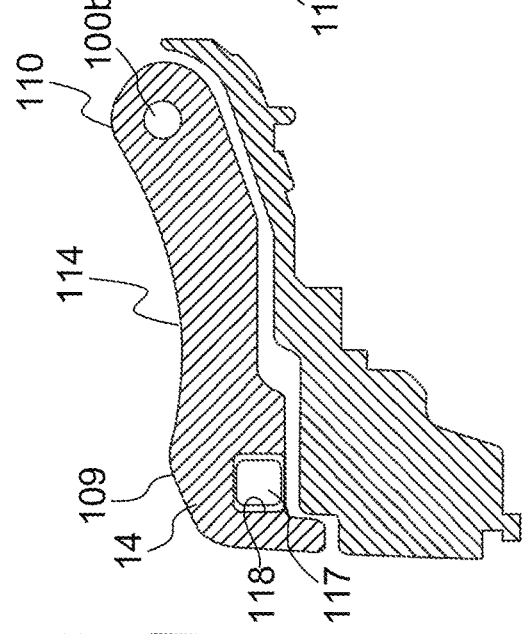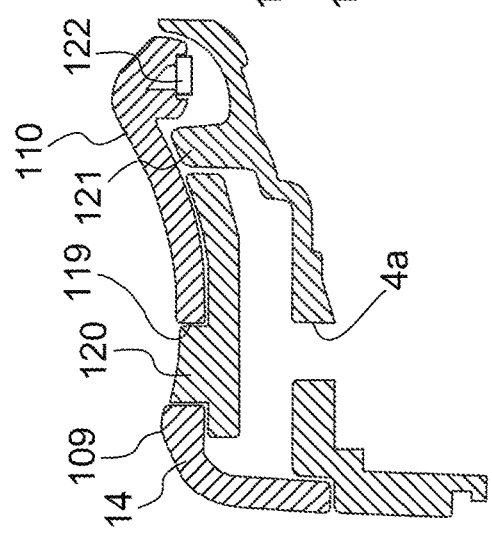

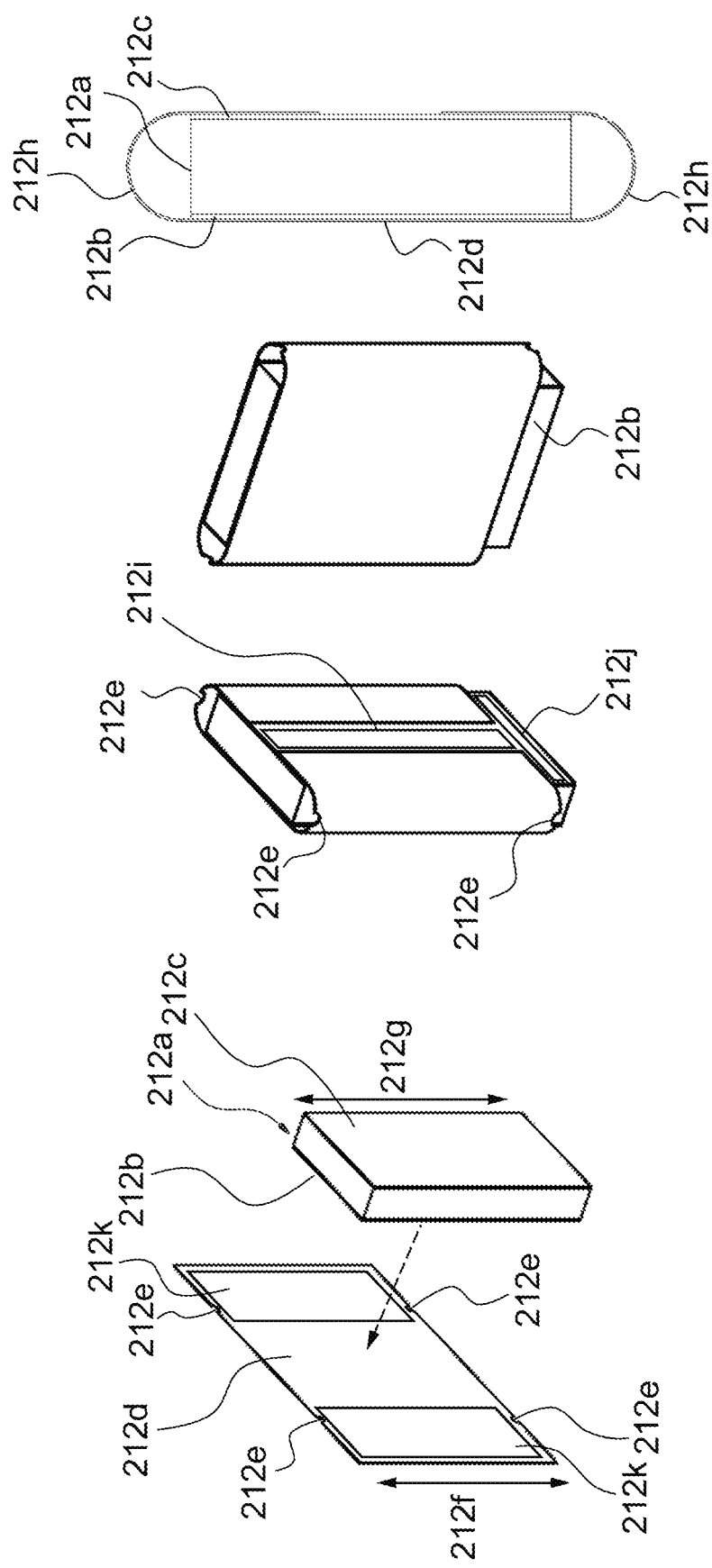

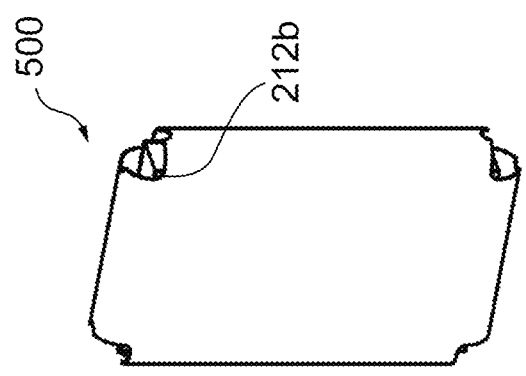
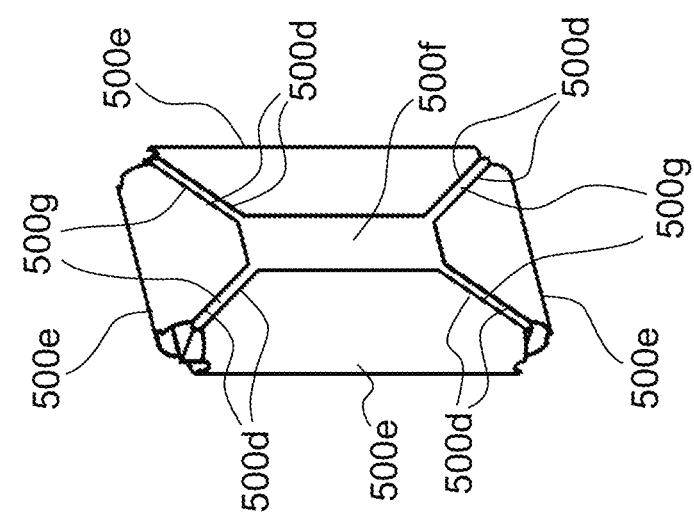
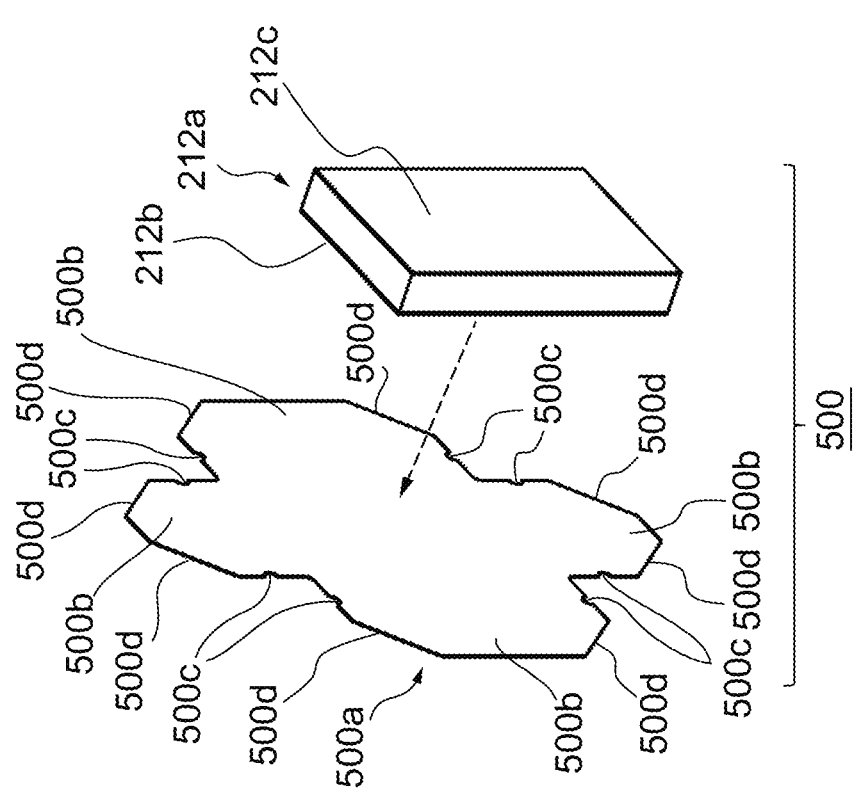

IMAGE PICKUP APPARATUS EQUIPPED WITH HEAT DISSIPATION MECHANISM

BACKGROUND OF THE INVENTION

Field of the Invention

The present invention relates to an image pickup apparatus that is equipped with a heat dissipation mechanism.

Description of the Related Art

An image pickup apparatus, such as a video camera, is provided with an image sensor that outputs an electrical signal corresponding to an object image formed by an image pickup optical system. Moreover, an image pickup apparatus is provided with a control substrate on which electronic parts, which include a signal processing circuit that applies a predetermined signal process to an image signal output from an image sensor and a control circuit that drivingly controls the entire apparatus, are implemented. Since a performance of an image sensor and performances of electronic parts implemented on a control substrate deteriorate as they generate heat and become hot, it is necessary to reduce a temperature rise in order to stabilize operations.

Particularly, an image pickup apparatus is required to mount an image sensor that has a high pixel density in recent years. Since a high-pixel-density image sensor has a large heat generation amount accompanying an operation, a more effective heat dissipation countermeasure than ever is needed. There is a known image pickup apparatus that provides a heat dissipation fin to a back face of an image sensor for a heat dissipation countermeasure and cools the image sensor by sending cold air to the dissipation fin with a fan built in the image pickup apparatus (Japanese Laid-Open Patent Publication (Kokai) No. 2009-206951 (JP 2009-206951 A)).

However, since the image pickup apparatus of the above-mentioned publication needs to install the fan inside the apparatus, a configuration is complicated, which enlarges the size of the image pickup apparatus and raises a cost. Accordingly, there is room for improvement in the mechanism for cooling a control substrate and a sensor substrate efficiently.

SUMMARY OF THE INVENTION

The present invention provides an image pickup apparatus that is capable of efficiently dissipating heat generated in the sensor substrate or the control substrate.

Accordingly, a first aspect of the present invention provides an image pickup apparatus including a lens unit that has an image pickup optical system, an image sensor that outputs an electrical signal corresponding to an object image formed through the image pickup optical system, a sensor substrate on which the image sensor is implemented, a first heat dissipation section that has four faces approximately parallel to an optical axis of the image pickup optical system and is fixed to the lens unit so that the four faces will surround the image pickup optical system from four sides, a control substrate that is thermally coupled with the first heat dissipation section, a second heat dissipation section that is arranged at a side opposite to the image pickup optical system in a direction of the optical axis with respect to the sensor substrate and is fixed to the first heat dissipation section, and a heat conduction member that is arranged between the sensor substrate and the second heat dissipation section in the direction of the optical axis so as to contact both of the sensor substrate and the second heat dissipation section.

According to the present invention, heat generated in the sensor substrate or the control substrate is dissipated efficiently.

Further features of the present invention will become apparent from the following description of exemplary embodiments with reference to the attached drawings.

BRIEF DESCRIPTION OF THE DRAWINGS

FIG. 4A, FIG. 4B, and FIG. 4C are views showing sections near the card cover in an A-A plane, a B-B plane, and a C-C plane in FIG. 1A, respectively.

FIG. 8A through FIG. 8D are perspective views describing a heat conduction member of the video camera.

FIG. 16A, FIG. 16B, and FIG. 16C are perspective views showing a heat conduction member of a video camera in a second embodiment of the present invention.

DESCRIPTION OF THE EMBODIMENTS

Figure 1A:
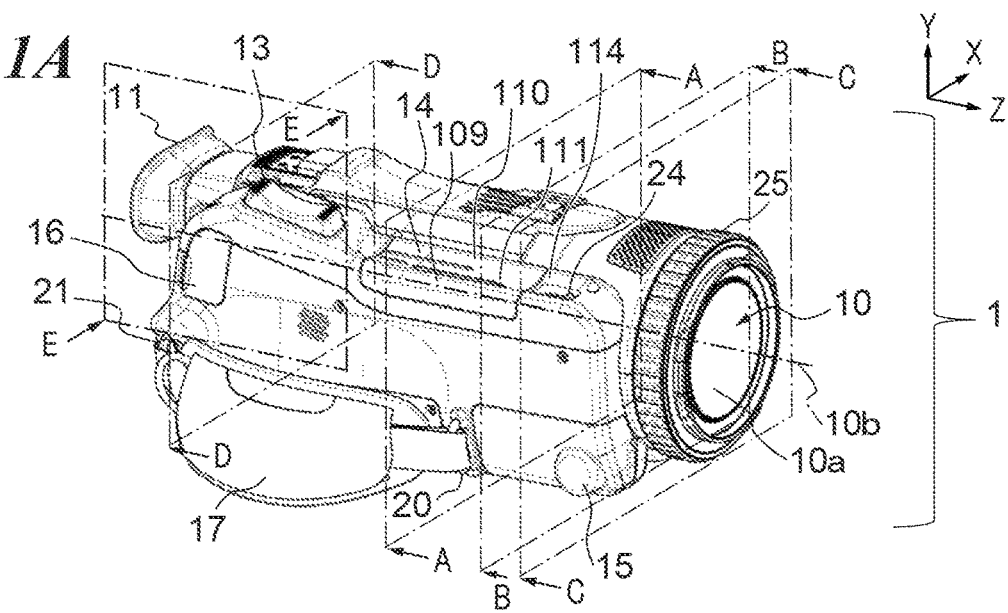
FIG. 1A, FIG. 1B, and FIG. 1C are perspective views showing a video camera as an image pickup apparatus concerning a first embodiment of the present invention.

Hereafter, embodiments according to the present invention will be described in detail by referring to the drawings.

Figure 1B:
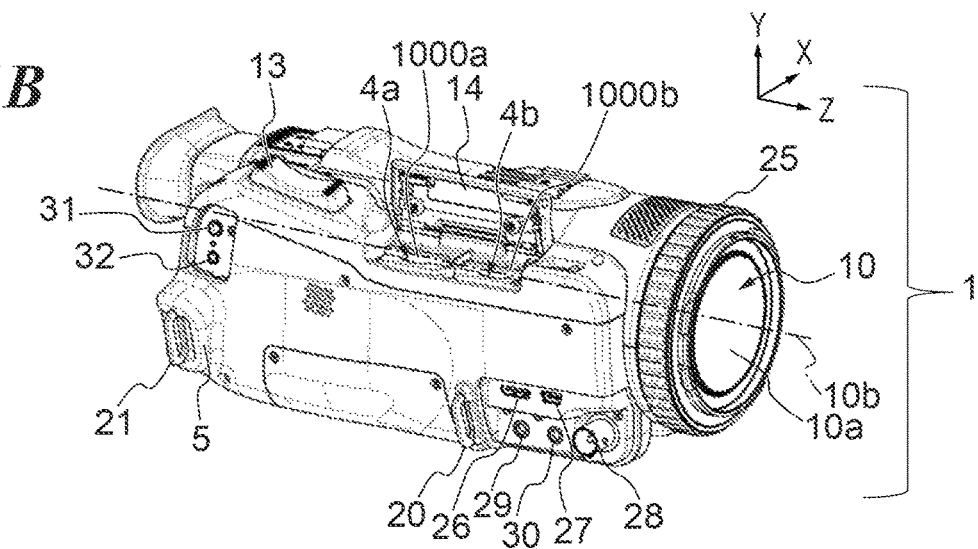
Figure 1C:
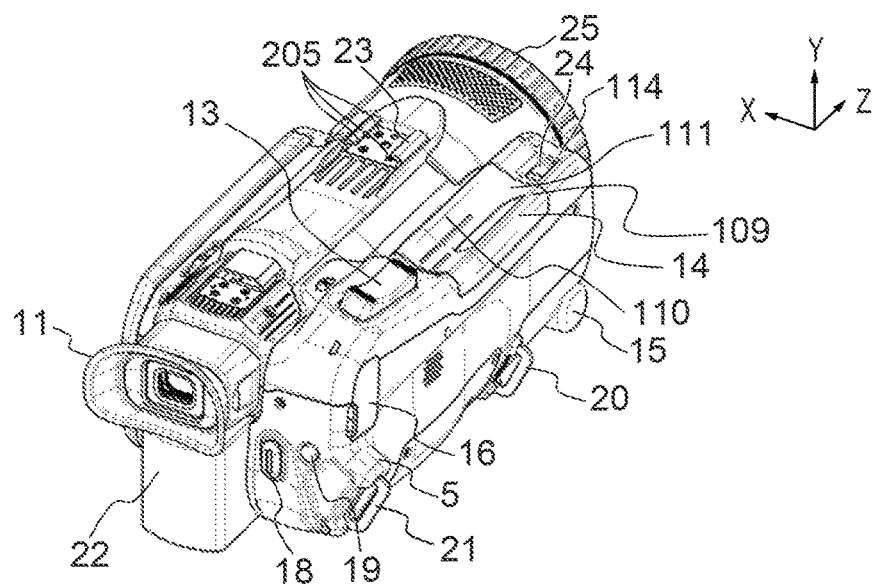

FIG. 1A, FIG. 1B, and FIG. 1C are perspective views showing an image pickup apparatus concerning a first embodiment of the present invention. A video camera 1 is exemplified as the image pickup apparatus. However, an apparatus to which the present invention is applied is not limited to an electronic apparatus called a camera. The present invention can be applied to an apparatus that has an image pickup optical system and an image sensor.

Hereinafter, an XYZ coordinate system will be used for defining an upper-and-lower direction, a left-and-right direction, and a front-and-back direction of the video camera 1. The Z-axis defines a direction of a capturing optical axis of the video camera 1. A positive (+) side on the Z-axis shall be a front side and a negative (−) side on the Z-axis shall be a back side. Accordingly, an object side is the front side and a user side is the back side. The X-axis defines the left-and-right direction (width direction) of the video camera 1 and the Y-axis defines the upper-and-lower direction in an XY plane that perpendicularly intersects with the Z-axis. A positive (+) side on the Y-axis shall be an upper side and a negative (−) side on the Y-axis shall be a lower side. Moreover, a positive (+) side on the X-axis shall be a right side and a negative (−) side on the X-axis shall be a left side.

The left-and-right direction is defined in a state where the video camera 1 is viewed from the object side. Based on these definitions, FIG. 1A and FIG. 1B are the external perspective views in a case where the video camera 1 is viewed from the front-left side, and FIG. 1C is the external perspective view viewed from the back-left side. It should be noted that FIG. 1B shows a state where a card cover 14 mentioned later is opened and a front-terminal protection cover and a back-terminal protection cover are detached. As shown in FIG. 1A, FIG. 1B, and FIG. 1C, an appearance surface of the video camera 1 is constituted so that an upper surface, a left surface, and a back face intersect almost perpendicularly.

The video camera 1 includes a lens unit 10, and an objective surface 10*a* of the lens unit 10 is exposed at the front side. The lens unit 10 has various optical elements that constitute an image pickup optical system. An optical axis 10*b* of the image pickup optical system is the capturing optical axis of the video camera 1. The video camera 1 is provided with an eyepiece display unit 11, a zoom operation button 13, a card cover 14, the front terminal protection cover 15, the back terminal protection cover 16, a grip belt 17, and a focus operation ring 25. A capturing button 18 and an image shot enlarging button 19 are provided in the back surface of the video camera 1 (FIG. 1C).
When the card cover 14 is in an opened state (FIG. 1B), card openings 4*a* and 4*b* are exposed.

FIG. 1B and FIG. 1C show a state where the grip belt 17 has been detached. The grip belt 17 is constituted so as to be attachable to and detachable from a front mount 20 and back mount 21 that are projected from the appearance surface of the left side of the video camera 1. Moreover, a back belt attachment projection 5 is formed around the back mount 21. A user holds the video camera 1 by passing a palm through the grip belt 17 attached so as to connect the front mount 20 and the back mount 21. When the user binds the grip belt 17 in this state, the palm of the user fits to the appearance surface of the video camera 1. And therefore, the user is able to operate the zoom operation button 13, the capturing button 18, and the image shot enlarging button 19 with a stable posture.

The user hangs the third finger and little finger on a concave portion of the card cover 14, and operates the zoom operation button 13, which is a seesaw switch, by an index finger and middle finger. Moreover, the user operates the capturing button 18 or the image shot enlarging button 19 with a thumb while holding the video camera 1 by sandwiching the back belt attachment projection 5 around the back mount 21 between the thumb and index finger.

A battery 22 is detachably attached to the back of the video camera 1. Moreover, an accessory attaching metal fitting 23 is installed in the front upper surface of the video camera 1. Various accessories, such as a light source for illuminating an object, can be attached to the accessory attaching metal fitting 23. The card cover 14 is provided in a predetermined position so as to straddle the front mount 20 in the front-and-back direction of the video camera 1. The user can open the card cover 14 by operating a cover lock 24 from a closed state shown in FIG. 1A to an opened state shown in FIG. 1B. When the user opens the card cover 14, card openings 4*a* and 4*b* are exposed and the user can attach and detach memory cards 1000*a* and 1000*b*.

The video camera 1 includes an image sensor 207 (FIG. 6B) that outputs an electrical signal corresponding to an object image formed by the image pickup optical system. The object image formed on the image sensor 207 through the lens unit 10 is converted into an electrical signal. A signal processor (not shown) implemented on a control substrate 215 mentioned later applies an image signal process to the electrical signal. Then, the processed electrical signal is saved in the memory card 1000*a* or 1000*b*. Moreover, the signal processor applies an image signal process for displaying to the electrical signal. The eyepiece display unit 11 displays an image based on the processed electrical signal.

The lens unit 10 is a zoom lens of which a capturing field angle is changed in a wide-angle direction or a telephoto direction by moving internal optical elements according to user's operations of the zoom operation button 13. The user can adjust the capturing field angle to an intended angle by operating the zoom operation button 13 while checking a displayed image on the eyepiece display unit 11. Then, the user starts video capture by pressing the capturing button 18 at an intended timing and finishes the video capture by pressing the capturing button 18 again.

The video camera 1 can adjust a focusing condition for an object by driving optical elements inside the lens unit 10 when the focus operation ring 25 is rotationally operated. Moreover, the video camera 1 can enlarge the image displayed on the eyepiece display unit 11 when the image shot enlarging button 19 is pressed. The user can ascertain the focusing state of the image in detail by pressing the image shot enlarging button 19 to enlarge the image before or during video capture.

Each of the front terminal protection cover 15 and back terminal protection cover 16 has an arm (not shown) that is inserted inside the video camera 1 and that is provided with a hook at the tip of the arm. Thereby, each of the protective covers 15 and 16 is opened when the user pulls the covers out from the video camera 1 and bends the arm. Moreover, although the hooks at the tips prevent the protection covers 15 and 16 from slipping off from the video camera 1, the covers can be detached as shown in FIG. 1B by deforming the hooks within a recoverable range, and the hooks can be re-inserted.

The protective covers 15 and 16 are lid members that cover terminals for connecting the video camera 1 with external devices. As shown in FIG. 1B, a HDMI (registered trademark) terminal 26, a USB terminal 27, an image output terminal 28, an audio output terminal 29, and an audio input terminal 30 are arranged in a range covered by the front terminal protection cover 15. Moreover, a remote operation terminal 32 for wired remote control and a power input terminal 31 are arranged in a range covered by the back terminal protection cover 16.

Figure 2A:
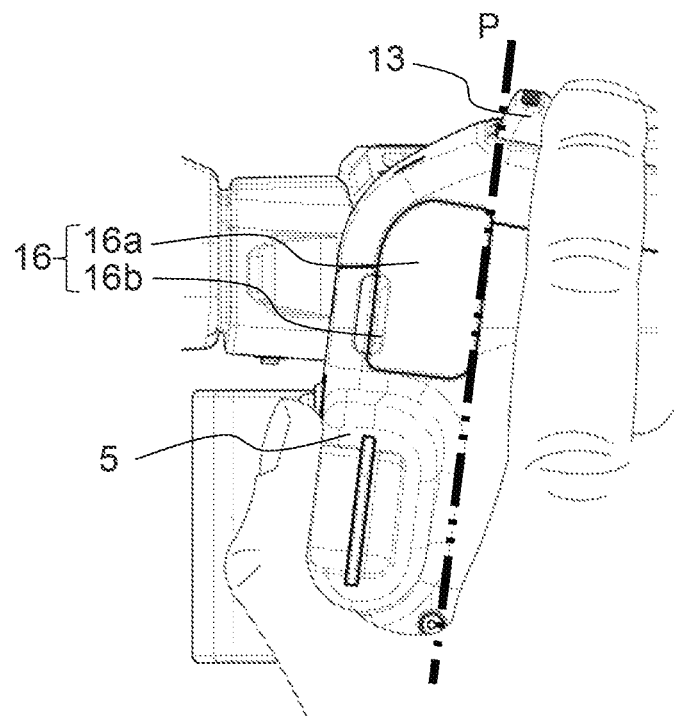
FIG. 2A and FIG. 2B are partial enlargement views showing a left side of the video camera.
Figure 2B:
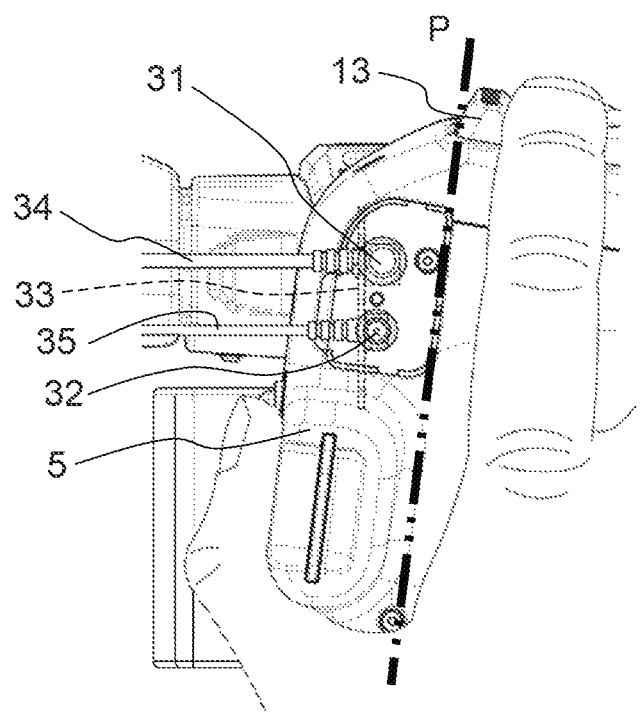

FIG. 2A and FIG. 2B are partial enlargement views around the back terminal protection cover 16 at the left side of the video camera 1. FIG. 2A shows a state where the back terminal protection cover 16 is attached. FIG. 2B shows a state where the back terminal protection cover 16 is removed and cables are connected to the video camera 1.

A boundary line P in FIG. 2A and FIG. 2B is an aerial line extended from the back end of the zoom operation button 13 in parallel to the operating direction of the zoom operation button 13 and shows the backmost position of an index finger in a case where a user operates the zoom operation button 13 while holding the video camera 1. In the left side of the video camera 1, the area that is the back side of the boundary line P and is the upper side of the back belt attachment projection 5 is hard to touch when the user holds the video camera 1. Accordingly, the back terminal protection cover 16 is arranged in this area.

Moreover, a main surface 16a of the back terminal protection cover 16 forms the approximately same surface with the left side of the video camera 1. Furthermore, a finger hook 16b of the back terminal protection cover 16 to which a finger is hooked when a user opens the front terminal protection cover 15 is formed to be projected from the back end of the main surface 16a of the back terminal protection cover 16 that is apart from the boundary line P. As a result of this, when the user holds the video camera 1, the main surface 16a and finger hook 16b of the back terminal protection cover 16 do not interrupt a right hand of the user. Moreover, since the back terminal protection cover 16 is exposed in the state where the user holds the video camera 1, the user can easily open/close or attach/detach the back terminal protection cover 16 using the left hand that does not hold the video camera 1.

Figure 10A:
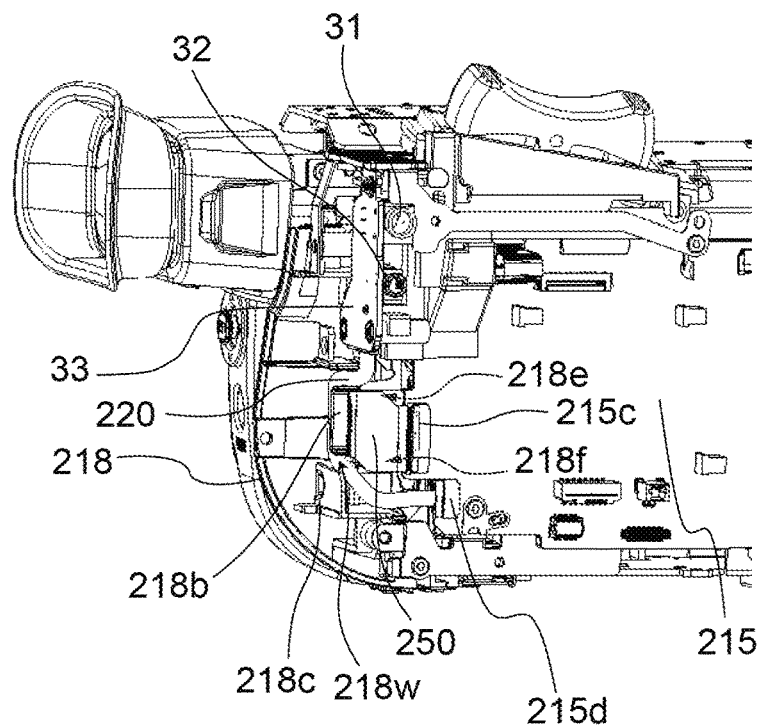
FIG. 10A and FIG. 10B are a perspective view and a back view showing a principal part of an internal structure of the video camera.

The power input terminal 31 and remote operation terminal 32 are implemented on an external power source substrate 33 that is arranged inside the video camera 1 and is shown with a broken line in FIG. 2B. Moreover, the external power source substrate 33 is electrically connected with the control substrate 215 through a power source wire 220 mentioned later (FIG. 10A). The power input terminal 31 and remote operation terminal 32 are arranged within the range covered with the back terminal protection cover 16 and are exposed in the state where the back terminal protection cover 16 is opened. Accordingly, even when a user holds the video camera 1 in the state where the external cables, such as the power cable 34 and the remote cable 35, are connected to the power input terminal 31 and remote operation terminal 32, the external cables do not interrupt a right hand of the user. Moreover, a plurality of terminals can be arranged by arranging the power input terminal 31 and remote operation terminal 32 up and down without spreading the contour in the front-and-back direction of the video camera 1.

Figure 3:
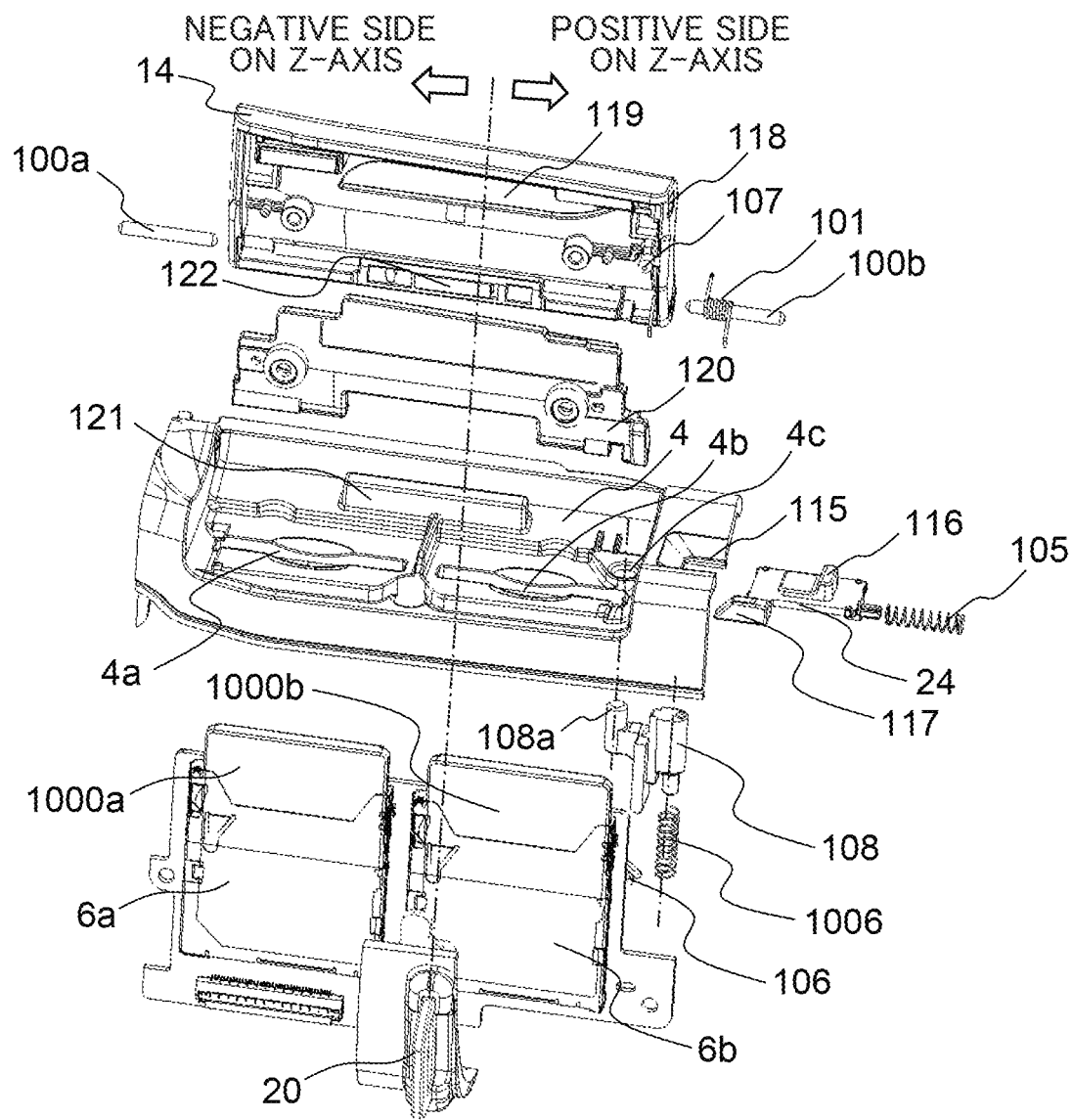
FIG. 3 is a development perspective view showing a principal part around a card cover of the video camera.

FIG. 3 is a development perspective view showing a principal part around the card cover 14. As shown in FIG. 1B and FIG. 3, two card holding members 6a and 6b to which memory cards 1000a and 1000b are detachably attached, respectively are provided inside the card openings 4a and 4b. As shown in FIG. 3, the card cover 14 is rotatable around rotation shafts 100a and 100b between a closed position at which the card openings 4a and 4b are protected and an opened position at which the card openings 4a and 4b are exposed.

A torsion coil spring 101 energizes the card cover 14 in an opening direction. The card cover 14 is kept at the closed position by a locking bar constituted from an internal mechanism. Moreover, the video camera 1 is provided with a detection mechanism that detects that the card cover 14 is at the closed position. This detection mechanism consists of a detection SW 106, a detection lever piece 108, and an operation boss 107. The detection lever piece 108 is energized upward by a detection lever spring 1006. An operation part 108a of the detection lever piece 108 is exposed from an opening 4c that is formed in an exterior cover.

In the closed position of the card cover 14, the operation boss 107 is inserted in the opening 4c at the side of the camera body and the operation part 108a of the detection lever piece 108 is pressed downward. When the operation part 108a of the detection lever piece 108 is pressed downward, the detection SW 106 is operated by the detection lever piece 108 and the video camera 1 can detect that the card cover 14 achieves the closed position. Moreover, since the operation boss 107 does not push the operation part 108a of the detection lever piece 108 in the state where the card cover 14 is opened, the detection lever piece 108 is moved upward by the detection lever spring 1006 and separates from the detection SW 106. In this way, the video camera 1 can electrically identify that the card cover 14 is at the closed position.

As shown in FIG. 1A and FIG. 1C, the card cover 14 has a first lid projection 109 that constitutes the upper surface of the video camera 1. Moreover, the card cover 14 has a second lid projection 110 that is higher than the first lid projection 109 and a lid depression 111 that smoothly connects the first lid projections 109 and the second lid projections 110. An appearance cover concave portion 114 is formed in the appearance cover at the front side of the card cover 14 so as to have the approximately same form of the lid depression 111.

Figure 5:
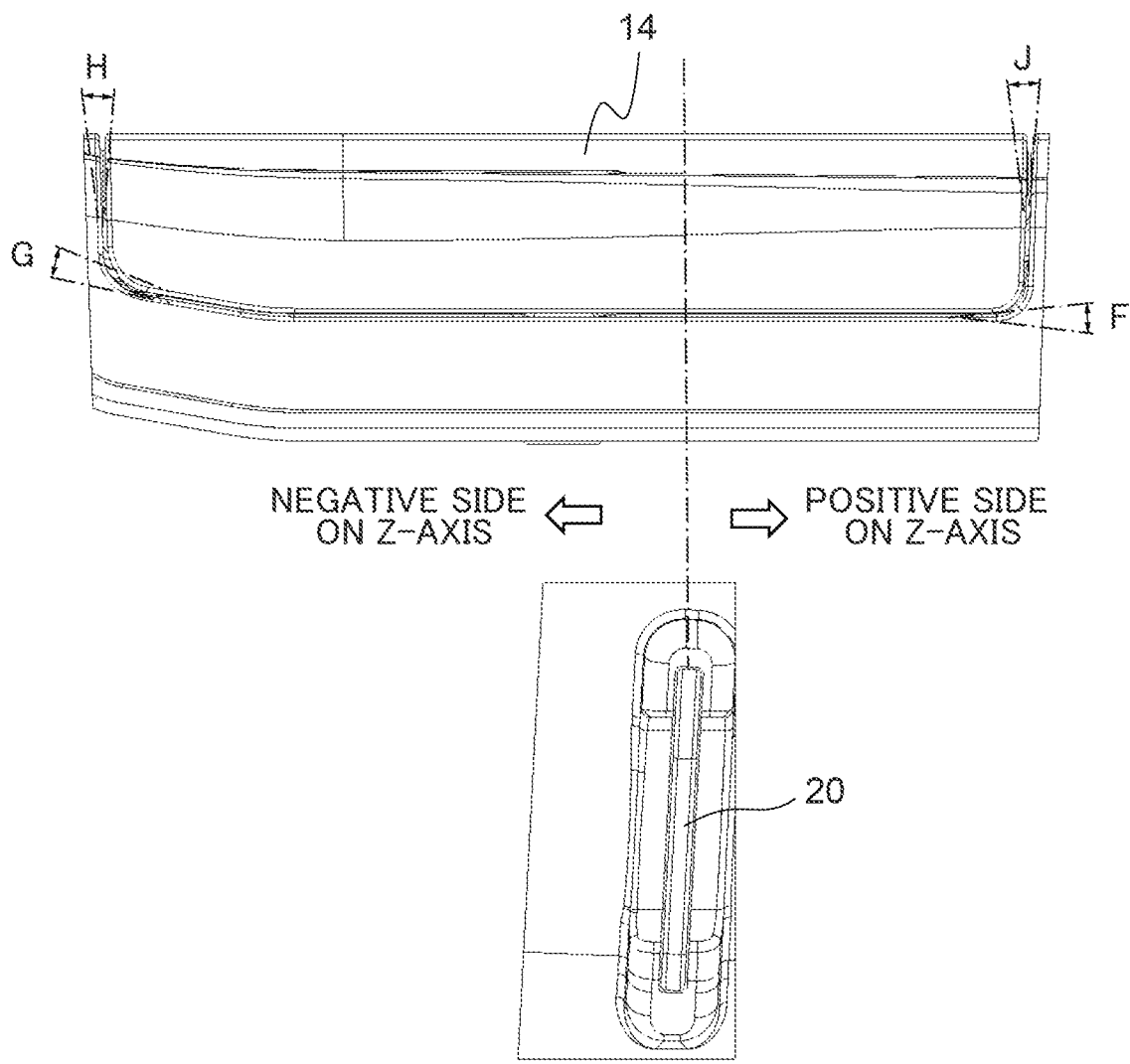
FIG. 5 is a view showing the card cover in a closed state and a front attachment part viewed from a left side.

FIG. 4A, FIG. 4B, and FIG. 4C are views showing sections near the card cover 14 in an A-A plane, a B-B plane, and a C-C plane in FIG. 1A, respectively. FIG. 5 is a view showing the card cover 14 in the closed state and the front mount 20 viewed from the left side.

As shown in FIG. 3, a knob operation opening 115 is formed in the front side (the positive side of the Z-axis) of the front mount 20. A cover opening knob 116 of the cover lock 24 is exposed from the knob operation opening 115. The cover lock 24 is slidable between a lock position to keep the card cover 14 at the closed position and a retracted position to open the card cover 14 from the closed position to the opened position. The sliding movement direction of the cover lock 24 is approximately parallel to the optical axis 10b. The cover lock 24 has an engagement projection 117. When the card cover 14 is at the closed position, the engagement projection 117 of the cover lock 24 engages to an engagement depression 118 provided in the side surface of the card cover 14, which keeps the card cover 14 in the closed state.

A user can moves the cover lock 24 from the lock position to the retracted position by operating the cover opening knob 116. This releases the engagement of the engagement projection 117 and the engagement depression 118, and the card cover 14 rotates to the opened position by the energization force of the torsion coil spring 101. In a free state, the cover lock 24 always returns to the lock position by a compression spring 105. Since the cover opening knob 116 of the cover lock 24 is arranged in the appearance cover depression 114, the user is prevented from touching the cover opening knob 116 carelessly when holding the video camera 1. Moreover, since fingertips are hooked by the second lid projection 110 of the card cover 14 when the user holds the video camera 1, the video camera 1 can be held in a stabilized state.

A window opening 119 is formed in the lid depression 111 of the card cover 14 within an area that covers projected positions of the memory cards 1000a and 1000b when viewed from the upper side (FIG. 4A). A window component 120 that is made from transparent material is exposed through the window opening 119. Thereby, even when the card cover 14 is at the closed position, the presence of the memory cards 1000a and 1000b can be sighted from the outside through the window component 120.

Moreover, the rotation shafts 100a and 100b of the card cover 14 and a lid support 121 (FIG. 4A) that supports the card cover 14 at the inside are provided in the inside of the second lid projection 110. The side surface of the lid support 121 abuts the card cover 14 and regulates the opened position. A shock absorber 122 is provided in a portion of the card cover 14 that abuts the lid support 121 to absorb impact sound.

Furthermore, since the lid support 121 is provided, the shakiness due to the pile of component tolerances that occurs when a user holds the video camera 1 is regulated. Since the torsion coil spring 101 is disposed at the front side (the positive side of the Z-axis) of the front mount 20, the front part of the card cover 14 is energized in the opening direction with the energization force of the torsion coil spring 101, which enlarges a vertical gap F (FIG. 5). On the contrary, since the back part of the card cover 14 becomes a rotation fulcrum of the card cover 14, a vertical gap G becomes narrow. Accordingly, since the user holds the video camera 1 at the back side of the front mount 20, the shakiness of the back part of the card cover 14 to which user's fingers hook becomes small, which enables the user to hold stably.

Moreover, the engagement projection 117 of the cover lock 24 energizes the card cover 14 backward with the compression spring 105 provided in the front side (the positive side of the Z-axis) of the front mount 20. Accordingly, a back gap H becomes narrow and a front gap J spreads (FIG. 5). Accordingly, even when the user pulls the card cover 14 backward while holding the video camera 1, the shakiness in the pulling direction diminishes and the holding of the video camera 1 is stabilized.

Figure 6A:
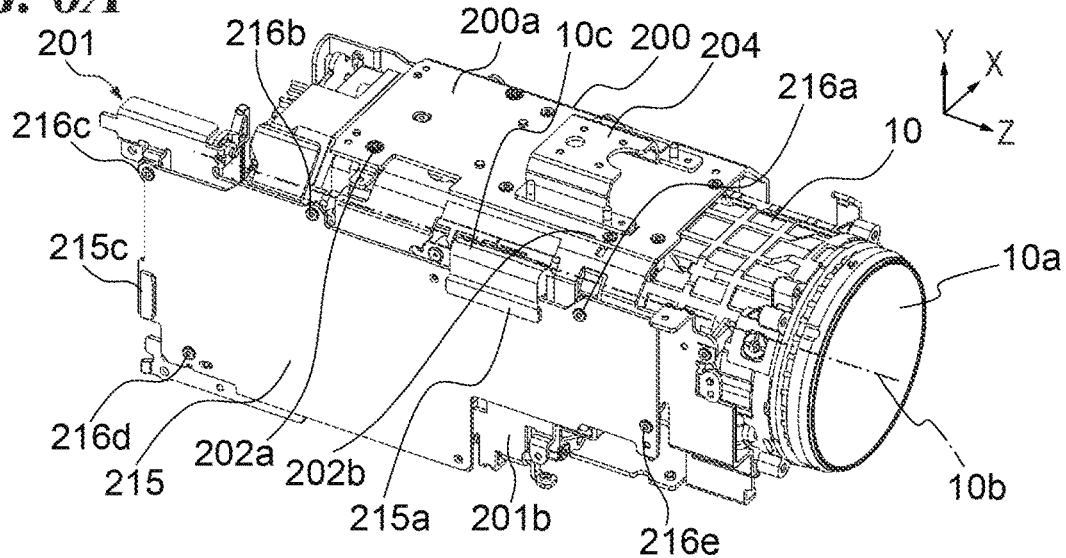
FIG. 6A, FIG. 6B, and FIG. 6C are perspective views showing an internal structure of the video camera.
Figure 6B:
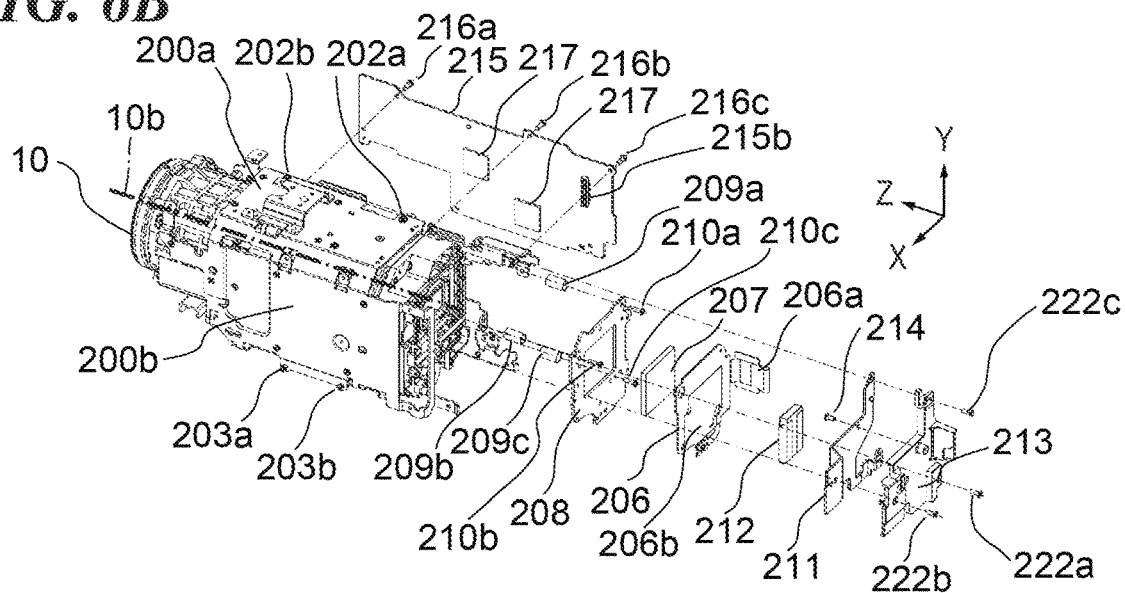
Figure 6C:
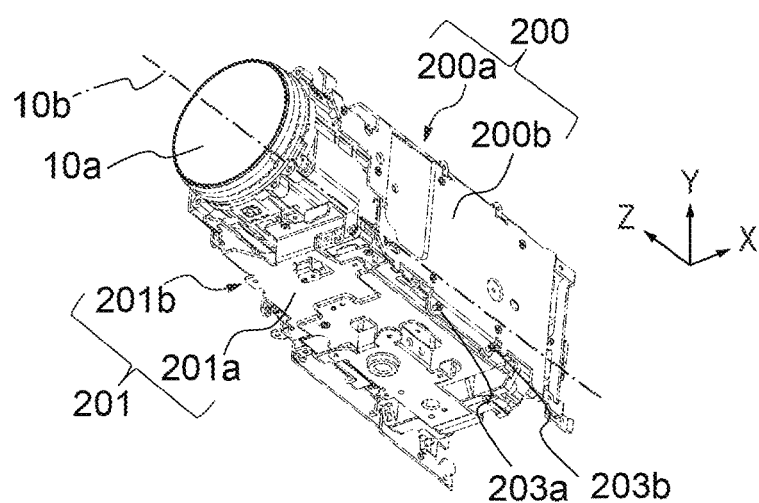
Figure 7:
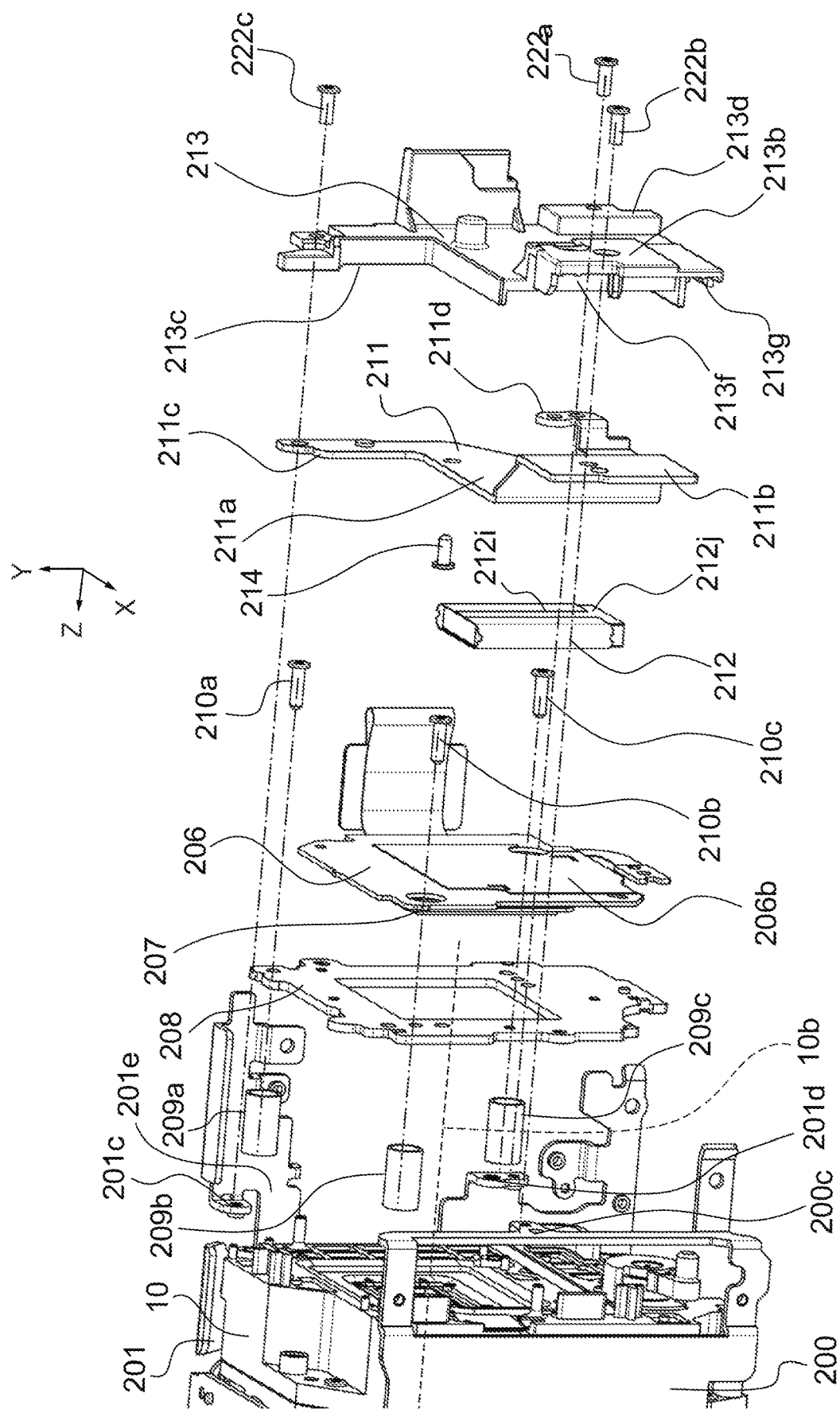
FIG. 7 is an exploded perspective view showing main components around an image sensor of the video camera.

FIG. 6A, FIG. 6B, and FIG. 6C are perspective views showing an internal structure of the video camera 1. Specifically, FIG. 6A is an upper-front perspective view in a state where components around the lens unit 10 are assembled, FIG. 6B is an upper-back perspective view in a state where main components are developed, and FIG. 6C is a lower-front perspective view in the state where the components around the lens unit 10 are assembled. FIG. 7 is an exploded perspective view showing main components around the image sensor. FIG. 8A through FIG. 8D are perspective views describing a heat conduction member 212.

Figure 9A:
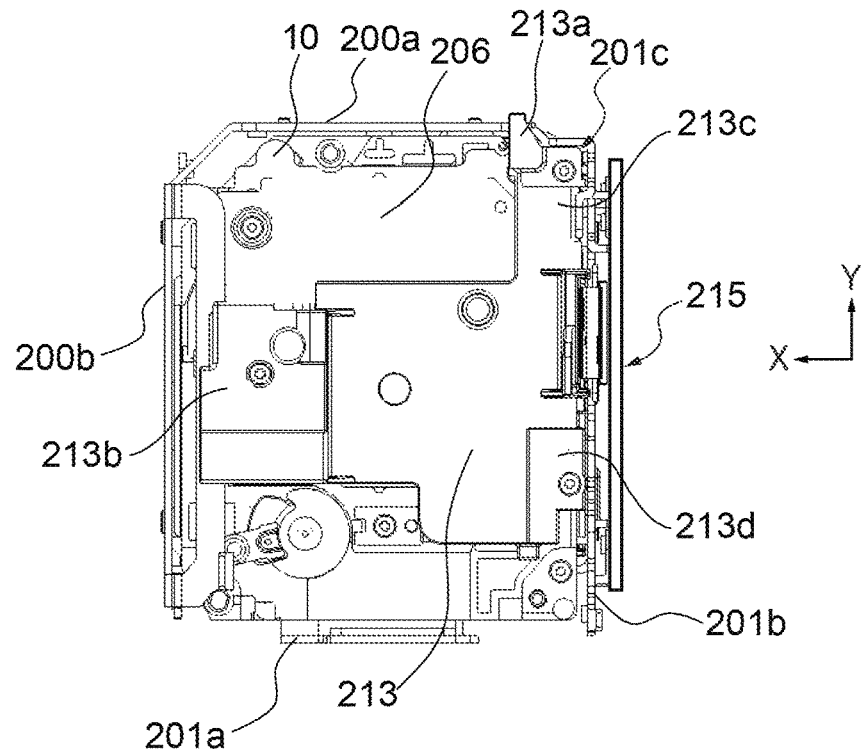
FIG. 9A and FIG. 9B are back views showing components around a lens unit of the video camera.
Figure 9B:
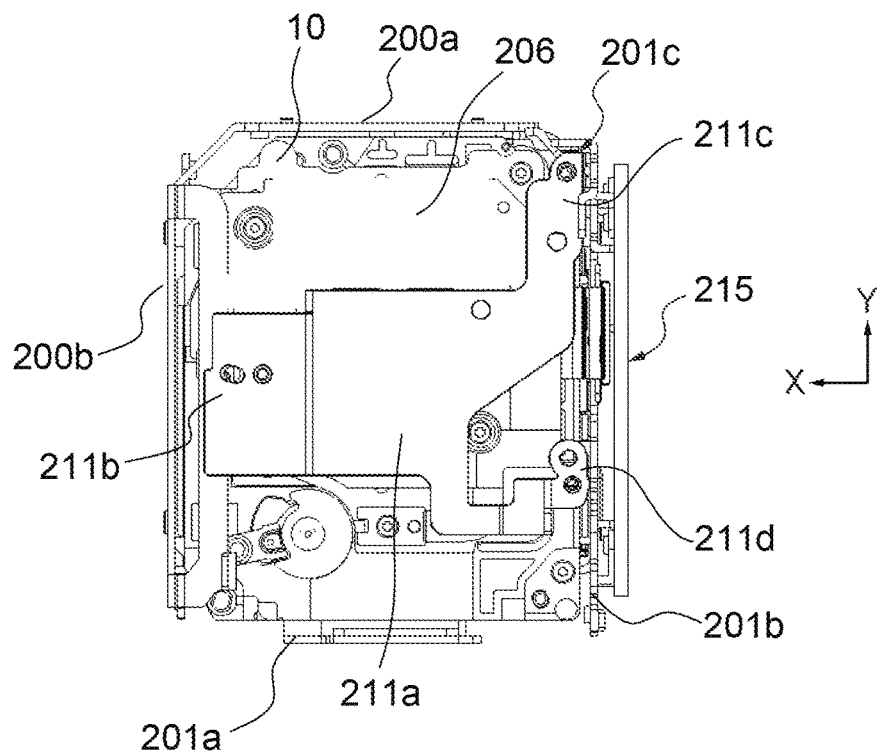
Figure 10B:
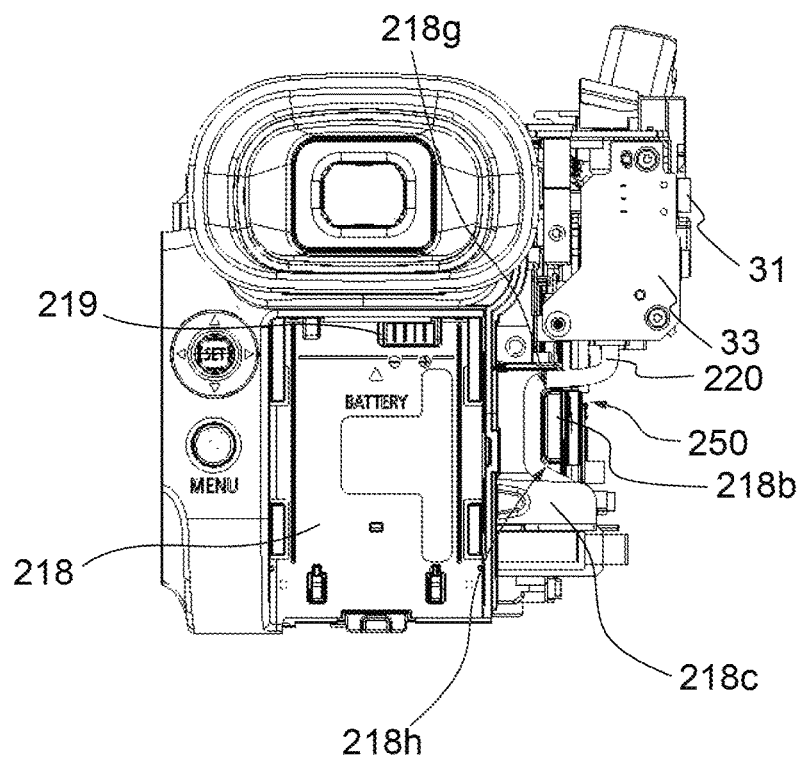
Figure 11A:
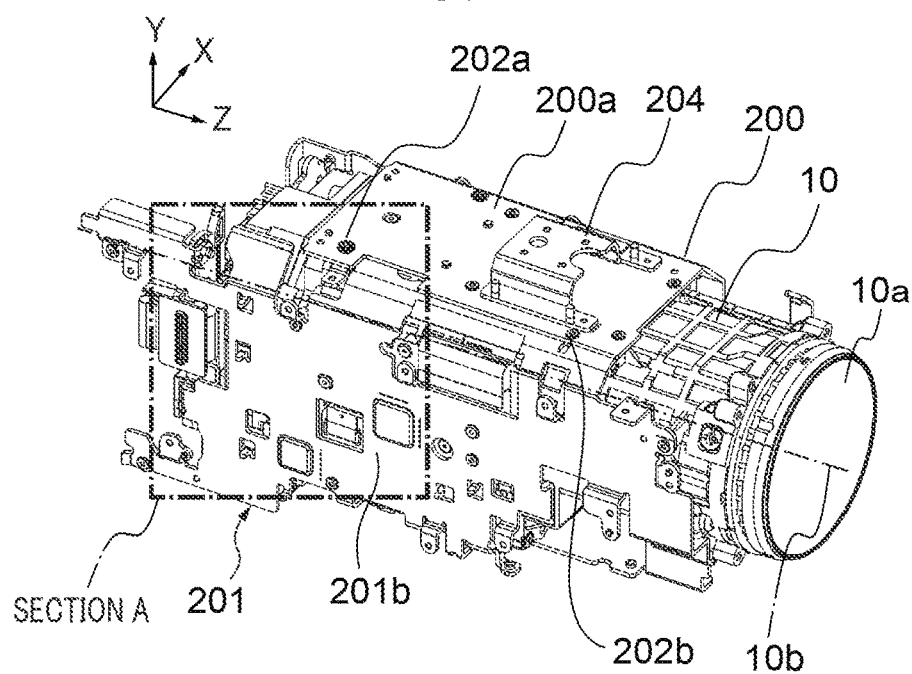
FIG. 11A and FIG. 11B are a perspective view and a partial enlarged view of the internal structure of the video camera.
Figure 11B:
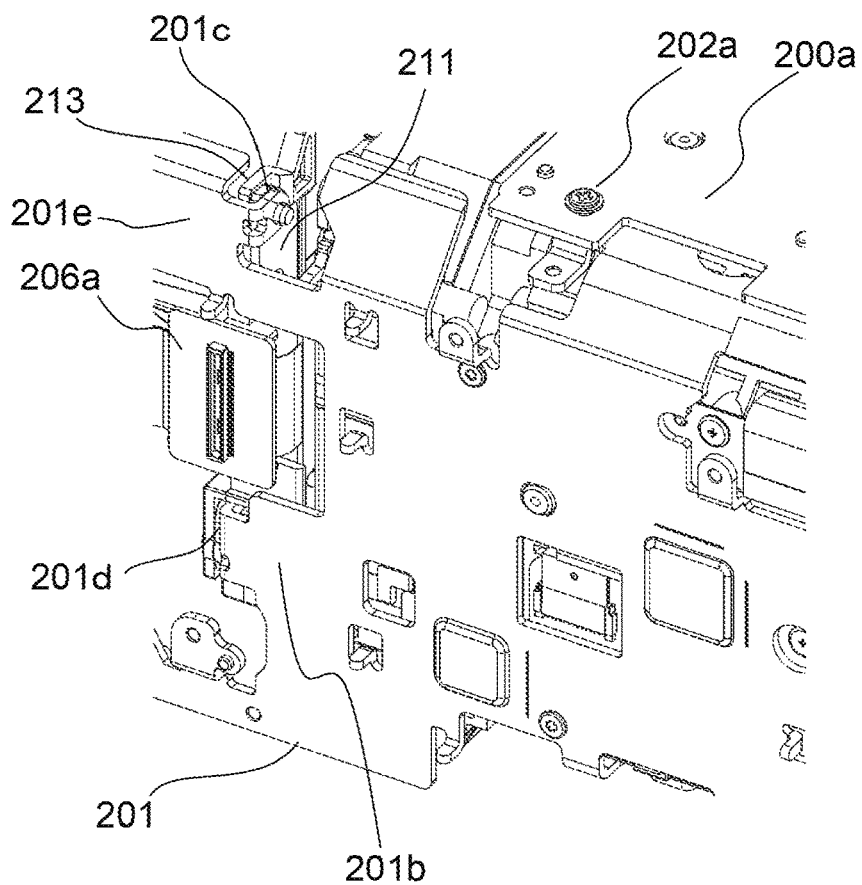

FIG. 9A and FIG. 9B are back views showing components around the lens unit 10. A reinforcement holder 213 is shown in FIG. 9A but is not shown in FIG. 9B. FIG. 10A and FIG. 10B are a perspective view and a back view showing a principal part of the internal structure of the video camera 1. FIG. 11A and FIG. 11B are a perspective view and a partial enlarged view of the internal structure of the video camera 1. Some components shown in FIG. 6A are not shown in FIG. 11A. FIG. 11B shows a section A in FIG. 11A in an enlarged state.

The video camera 1 of the embodiment has a first heat dissipation section and a second heat dissipation member as main heat dissipation members for dissipating heat generated by the electronic parts on the control substrate 215 and the image sensor 207. The first heat dissipation section consists of an upper-right heat dissipation member 200 and a lower-left heat dissipation member 201. A sensor heat sink 211 corresponds to the second heat dissipation member.

As shown in FIG. 6C, the upper-right heat dissipation member 200 is made of one metal plate and is constituted of an upper face 200a and a right face 200b that are two faces (two walls) approximately parallel to the optical axis 10b of the lens unit 10, and exhibits a reverse "L" shape when viewed from the front side. The lower-left heat dissipation member 201 is made of one metal plate and is constituted of a lower face 201a and a left face 200b that are two faces (two walls) approximately parallel to the optical axis 10b, and exhibits an "L" shape when viewed from the front side. The upper-right heat dissipation member 200 and lower-left heat dissipation member 201 are in surface contact with each other at their ends and are tightened with side fixing screws 203a and 203b (FIG. 6C) and upper fixing screws 202a and 202b (FIG. 6A).

Accordingly, the first heat dissipation section (heat dissipation members 200 and 201) exhibits a rectangle when viewed from the front side. Thereby, the four side surfaces of the lens unit 10 around the optical axis 10b are enclosed by the first heat dissipation section constituted integrally. The upper-right heat dissipation member 200 and the lower-left heat dissipation member 201 are manufactured with high-intensity aluminum alloy that has high heat conductivity and high mechanical strength and are fixed to the lens unit 10 with the plurality of screws. Accordingly, the first heat dissipation section has the four faces 200a, 200b, 201a, and 201b approximately parallel to the optical axis 10b, and is fixed to the lens unit 10 so as to surround the image pickup optical system from the four sides with the four faces.

As shown in FIG. 6B and FIG. 7, the image sensor 207 is implemented on the image sensor substrate 206. A sensor fixing metal sheet 208 is arranged to the front side of the image sensor substrate 206. Since the lens unit 10 has individual variation in a focus position and the direction of the optical axis 10b, it is necessary to arrange the image sensor 207 in a suitable position and posture in response to the individual variation of the lens unit 10. The sensor fixing metal sheet 208 has a rectangular shape with a rectangular opening corresponding to the circumference of the image sensor 207. The image sensor 207 is fixed to the sensor fixing metal sheet 208 with adhesive (not shown) after adjusting the relative position with sufficient accuracy.

Sensor springs 209a, 209b, and 209c, which generate energization force in a direction for separating the sensor fixing metal sheet 208 and the unit 10 mutually, are arranged between the sensor fixing metal sheet 208 and the lens unit 10. Furthermore, sensor positioning screws 210a, 210b, and 210c are tightened from the back side of the sensor fixing metal sheet 208 so as to overcome the reaction force of the sensor springs 209a, 209b, and 209c. This enables individual front-and-back movements of the arrangement positions of the sensor positioning screws 210a, 210b, and 210c of the sensor fixing metal sheet 208.

A worker can appropriately arrange the image sensor 207 without being influenced by individual variation of the lens unit 10 by tightening each of the sensor positioning screws 210a, 210b, and 210c properly. That is, the front-and-back position and the tilt to the optical axis 10b of the image sensor 207 can be adjusted (tilt adjustment). Since the image sensor substrate 206 on which the image sensor 207 is implemented is fixed after adjusting individually in this way, the position of the image sensor substrate 206 to the lens unit 10 differs for every individual of the video camera 1.

The control substrate 215 (FIG. 6A and FIG. 6B) is a circuit board that mainly controls the entire video camera 1 including the image sensor 207. The control substrate 215 is connected with the lower-left heat dissipation member 201 by a plurality of substrate fixing screws 216a through 216e. A lens connector 215a (FIG. 6A), sensor connector 215b (FIG. 6B), and power source connector 215c (FIG. 6A) are implemented on the control substrate 215.

The control substrate 215 and the image sensor substrate 206 are electrically connected because a connector 206a of the image sensor substrate 206 is connected to the sensor connector 215b. Moreover, the control substrate 215 and the lens unit 10 are electrically connected because a flexible wiring board 10c prolonged from the lens unit 10 is connected to the lens connector 215a.

As shown in FIG. 6B, a heat conduction rubber 217 that is soft and deformable is arranged between the control substrate 215 and the lower-left heat dissipation member 201. The heat conduction rubber 217 is arranged between an electrical component (not shown) as a heating source implemented on the control substrate 215 and the lower-left heat dissipation member 201 and adheres to the both. Thereby, the control substrate 215 is thermally coupled with the lower-left heat dissipation member 201. The heat that is generated by the electrical component on the control substrate 215 is transferred to the lower-left heat dissipation member 201 through the heat conduction rubber 217.

The heat conduction member 212, the sensor heat sink 211, and the reinforcement holder 213 are arranged behind the image sensor substrate 206. Incidentally, as shown in FIG. 6A, an exterior fastening member 204 is fixed to the upper-front surface of the upper-right heat dissipation member 200. The accessory attaching metal fitting 23 is tightened to the exterior fastening member 204 with metal fitting fixing screws 205 (FIG. 1C). The exterior fastening member 204 is made from stainless material of which heat conductivity is lower than that of the upper-right heat dissipation member 200. Since the accessory attaching metal fitting 23 is fixed to the upper-right heat dissipation member 200 with high rigidity, the strong structure that is resistant to impulse force or static pressure from the outside at the time of attaching an accessory is obtained.

Moreover, the accessory attaching metal fitting 23 that a user may touch is connected to the upper-right heat dissipation member 200 through the exterior fastening member 204 made from low heat conductivity material and the appearance cover. Accordingly, since heat conduction from the upper-right heat dissipation member 200 to the accessory attaching metal fitting 23 is restricted, the accessory attaching metal fitting 23 hardly reaches high temperature.

As shown in FIG. 7, the heat conduction member 212 is pasted and fixed to a central part 211a of the sensor heat sink 211 from the front side. The heat conduction member 212 has elasticity of a low load in the direction of the optical axis 10b and is arranged so as to be in surface contact with both the image sensor substrate 206 and the sensor heat sink 211. That is, the heat conduction member 212 is arranged between the image sensor substrate 206 and the sensor heat sink 211 in the direction of the optical axis 10b so as to be contact with both the image sensor substrate 206 and the sensor heat sink 211.

A projection area of the image sensor 207 in the back face (the face opposite to the face to which the image sensor 207 is implemented) of the image sensor substrate 206 serves as a heat sink surface 206b. Other electrical components are not arranged on the heat sink surface 206b. A conductor insulation protection film of the substrate surface is removed and the conductor of the image sensor substrate 206 is exposed in the heat sink surface 206b. The heat conduction member 212 is in surface contact with the heat sink surface 206b of the image sensor substrate 206. Moreover, the heat conduction member 212 is in surface contact with the front face that is approximately perpendicular to the optical axis 10b in the central part 211a of the sensor heat sink 211. In this way, a heat path is formed between the image sensor substrate 206 and the sensor heat sink 211 by the configuration interposing the heat conduction member 212. Thereby, the heat of the image sensor 207 is effectively transferred to the sensor heat sink 211 at the back side.

The configuration of the heat conduction member 212 will be described in more detail. As shown in FIG. 8A, the heat conduction member 212 consists of an elastic member 212a that is approximately rectangular when viewed in the direction of the optical axis 10b and a thin rectangular copper foil sheet (heat conduction sheet) 212d that wraps the heat conduction member 212a. The elastic member 212a has elasticity of a low load and is constituted in a flat rectangular parallelepiped shape.

Mutually opposite surfaces that have the largest area in the elastic member 212a are defined as principal planes. The principal planes are approximately perpendicular to the optical axis 10b. A first double-sided tape 212b and a second double-sided tape 212c are pasted on the respective principal planes. The first double-sided tape 212b and the second double-sided tape 212c supply adhesive surfaces to the elastic member 212. The copper foil sheet 212d has a plurality of notches 212e. A width 212f of a short side of the copper foil sheet 212d is shorter than a length 212g of a long side of the elastic member 212a.

The elastic member 212a is pasted on the center of the copper foil sheet 212d with the first double-sided tape 212b. Both sides of the copper foil sheet 212d that are not pasted to the first double-sided tape 212b are referred to as arms 212k. The two arms 212k are turned up so as to wrap the elastic member 212a using the notches 212e as indices and are pasted and fixed to the second double-sided tape 212c. Thereby, the copper foil sheet 212d forms heat conduction paths 212h (FIG. 8D) between front and back surfaces of the heat conduction member 212.

Moreover, the heat conduction member 212 has an exposure area 212i in the long-side direction and an exposure area 212j in the short-side direction that are not covered with the copper foil sheet 212d. Since the exposure areas 212i and 212j are parts of the second double-sided tape 212c, they have coking property. The exposure areas 212i and 212j adhere to the sensor heat sink 211. The entire exposure area constituted by the exposure areas 212i and 212j is connected to all the faces (vertical and horizontal faces) connected to the two principal planes of the elastic member 212a.

In this way, the copper foil sheet 212d forms the heat conduction paths 212h between the front and back surfaces of the heat conduction member 212. And the exposure areas 212i and 212j enables to be pasted and fixed to the sensor heat sink 211. In a state where the sensor heat sink 211 is assembled to the lens unit 10, the heat conduction member 212 is compressed and the copper foil sheet 212d adheres to the heat sink surface 206b and the sensor heat sink 211. Since the exposure areas 212i and 212j lie in both the long-side direction and the short-side direction of the elastic member 212a, i.e., since the exposure areas are connected to all the surfaces connecting to the two principal planes of the elastic member 212a, the heat conduction member 212 is stably pasted.

Moreover, the elastic member 212a is compressed as a whole and adheres certainly without giving an excessive load to the image sensor substrate 206. The compression amount of the elastic member 212a is set so as to adhere certainly even if the position of the image sensor substrate 206 to the lens unit 10 differs for every individual of the video camera 1 because of adjustment of a focus position and adjustment of tilt in the direction perpendicular to the optical axis 10b. For example, the heat conduction member 212 intervenes between the image sensor substrate 206 and the sensor heat sink 211 in a compression state corresponding to tilt to the optical axis 10b due to the tilt adjustment of the image sensor substrate 206. This facilitates the tilt adjustment of the image sensor substrate 206.

Next, the sensor heat sink 211 and the reinforcement holder 213 will be described in detail. Generally, since a high-density image sensor has a high sensitivity to variation of a focus position of an image pickup optical system (i.e., variation in an optical axis direction), a slight variation affects a captured image. Accordingly, it is desired to dissipate heat of an image sensor effectively with a configuration that does not give an excessive stress from outside. In this embodiment, the sensor heat sink 211 and the reinforcement holder 213 are constituted in consideration of the above desire.

The sensor heat sink 211 shown in FIG. 7 is formed by a metal plate that is made from material, such as pure copper and pure aluminum, that is comparatively elastic and has a high heat conductivity. The sensor heat sink 211 is integrally formed by the large flat central part 211a, a right arm 211b extended from the central part 211a to the +X side, an upper arm 211c extended to the −X side from the upper side of the central part 211a, and a lower arm 211d extended to the −X side from the lower side. The reinforcement holder 213 as a reinforcement member is arranged behind the sensor heat sink 211 (the opposite side of the image pickup optical system in the direction of the optical axis 10b). The reinforcement holder 213 is made from material like plastic of which heat conductivity is lower than that of metal. The reinforcement holder 213 has a right arm 213b that covers the right arm 211b of the sensor heat sink 211 from the back side. Moreover, the reinforcement holder 213 has an upper left arm 213c and a lower left arm 213d that respectively cover the upper arm 211c and the lower arm 211d of the sensor heat sink 211 from the back side.

The reinforcement holder 213 is united with the sensor heat sink 211 by tightening to the sensor heat sink 211 from the back side with a unification screw 214 in a state overlapping with the sensor heat sink 211 when viewed in the direction of the optical axis 10b. Although the sensor heat sink 211 has a high thermal conductivity, it tends to deform because of a low mechanical strength. However, since the reinforcement holder 213 is united with the sensor heat sink 211, the mechanical strength of the sensor heat sink 211 is secured and deformation is prevented.

The sensor heat sink 211 and reinforcement holder 213, which are united, are tightened to a stationary part 200c of the upper-right heat dissipation member 200, an upper stationary part 201c and a lower stationary part 201d of the lower-left heat dissipation member 201 with fixing screws 222a, 222b, and 222c. Accordingly, the sensor heat sink 211 formed with the high heat conductivity material is fixed to the upper-right heat dissipation member 200 and the lower-left heat dissipation member 201 in the surface contact state. Accordingly, the reinforcement holder 213 in the state united with the sensor heat sink 211 is fixed to the first heat dissipation section (heat dissipation members 200 and 201). Particularly, the reinforcement holder 213 and the sensor heat sink 211 are fixed to the first heat dissipation section at the three same places when viewed in the direction of the optical axis 10b. Moreover, since the three above-mentioned places are spaced mutually, the reinforcement effects of the reinforcement holder 213 and the first heat dissipation section are high. It should be noted that the fixing places to the first heat dissipation section are not limited to three places. Two or more places that are spaced mutually are preferable and four or more places may be used.

Incidentally, since the image sensor 207 is fixed to the image sensor substrate 206 while adjusting the position finely, the image sensor substrate 206 and the back side of the lens unit 10 are sensitive to external force. As shown in FIG. 9A, the reinforcement holder 213 is arranged so as to extend over the back opening of the square cylinder shape formed by the upper-right heat dissipation member 200 and lower-left heat dissipation member 201 when viewed in the direction of the optical axis 10b. Since the reinforcement holder 213 functions like a beam between the upper-right heat dissipation member 200 and lower-left heat dissipation member 201, a mutual positional relationship between the upper-right heat dissipation member 200 and lower-left heat dissipation member 201 becomes rigid.

Furthermore, an extended part 213a is provided in the reinforcement holder 213 (FIG. 9A). The extended part 213a is located near the upper stationary part 201c and is projected upward from the image sensor substrate 206 and the lens unit 10 when viewed from the back side. In other words, the extended part 213a extends to the outside of the outline of the image sensor substrate 206 and to the outside of the outline of the lens unit 10 when viewed in the direction of the optical axis 10b. Thereby, the image sensor substrate 206 and the back (the part near the part where the image sensor substrate 206 is attached, particularly) of the lens unit 10 are protected from external force. Accordingly, the image sensor substrate 206 and the back of the lens unit 10 to which the image sensor substrate 206 is attached are protected by giving resistance against the external load applied to the appearance surface of the video camera 1.

Figure 12:
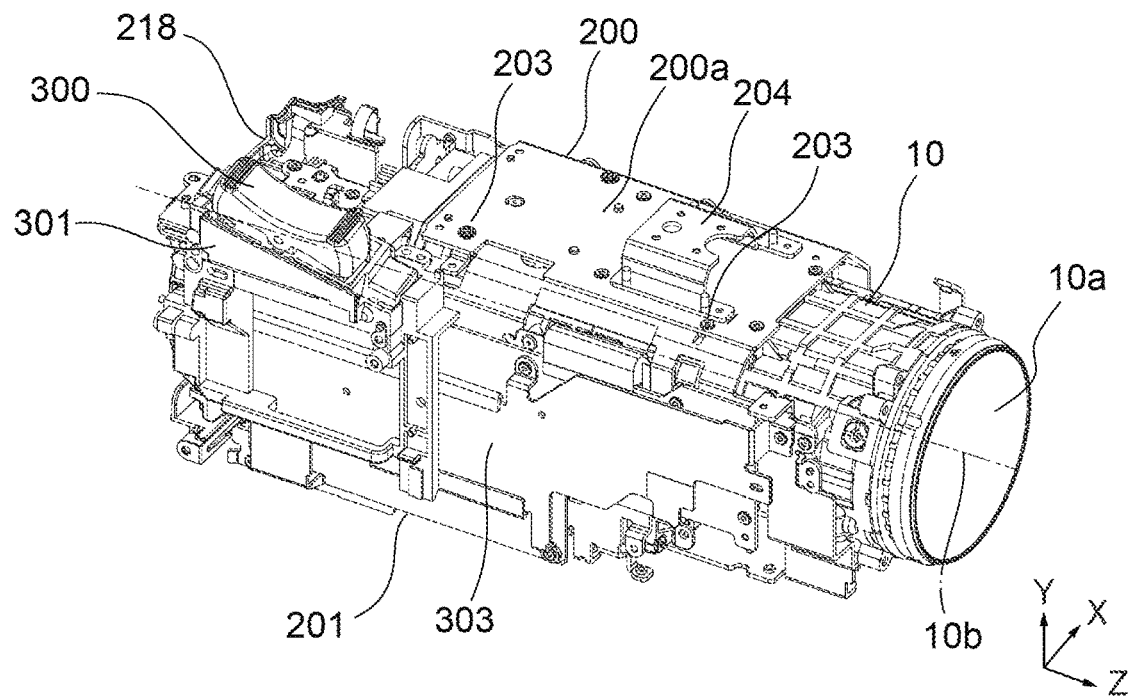
FIG. 12 is a perspective view showing the video camera in a state where construction components around a zoom operation button are exposed.
Figure 13:
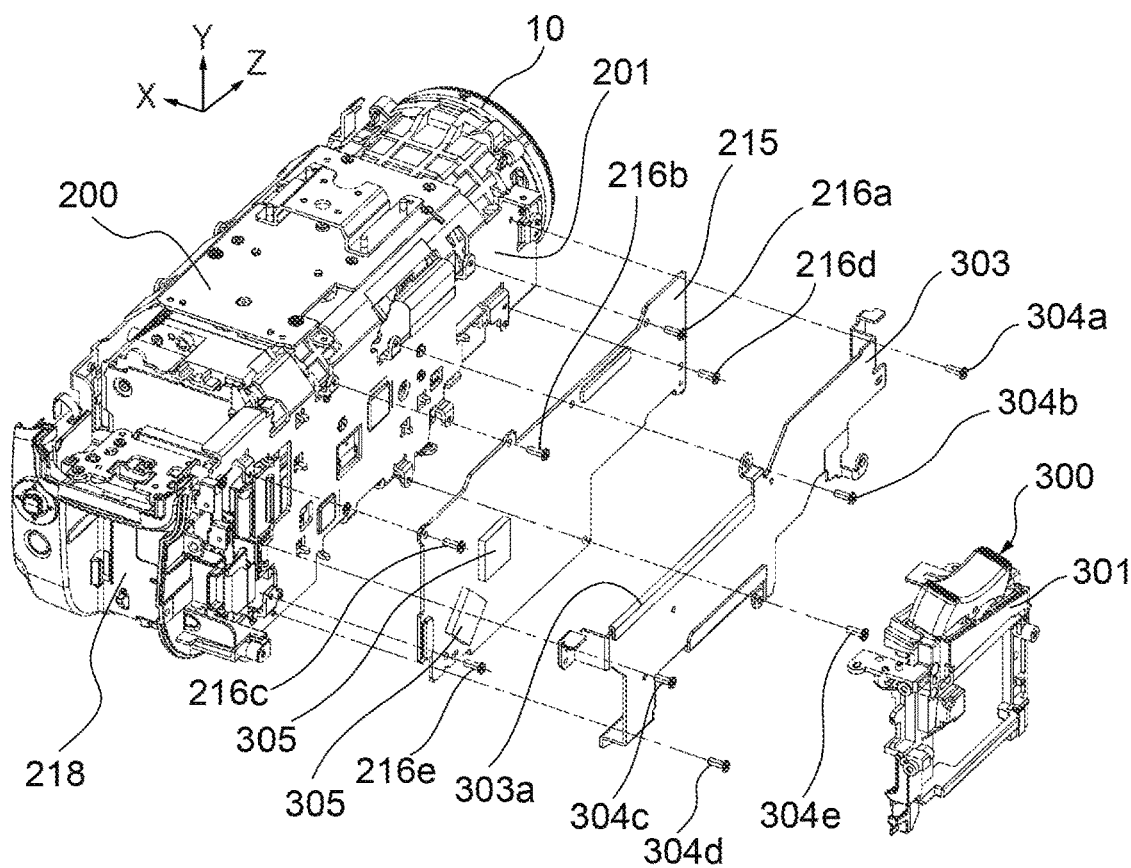
FIG. 13 is a deployment perspective view showing a circumference of the zoom operation button.
Figure 14E:
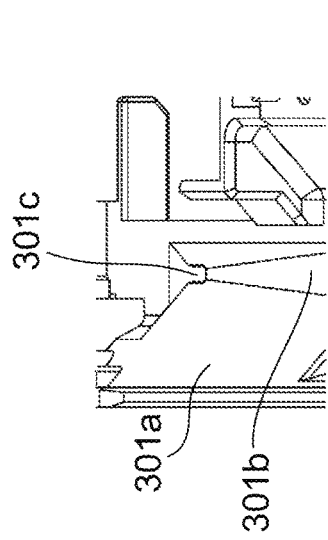
FIG. 14A through FIG. 14F are partial perspective views showing a zoom operation unit of the video camera.
Figure 14F:
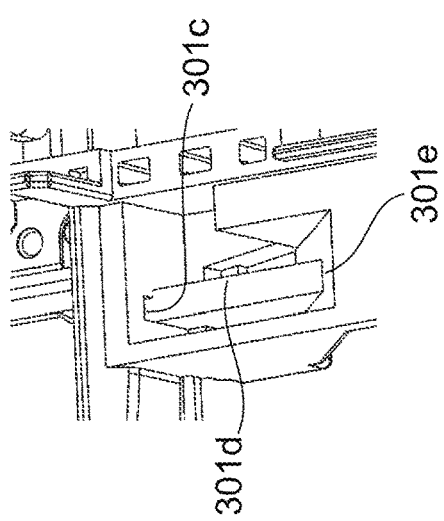
Figure 14C:
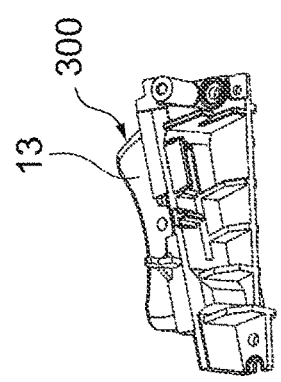
Figure 14D:
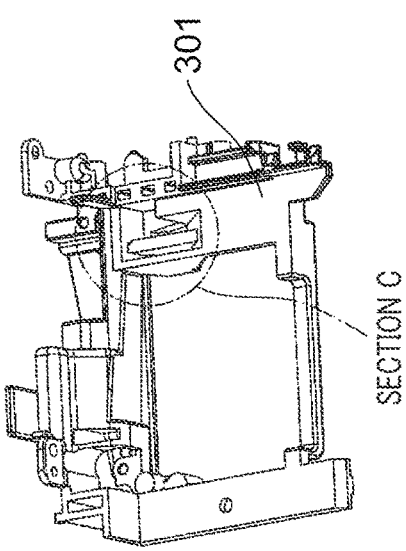
Figure 14A:
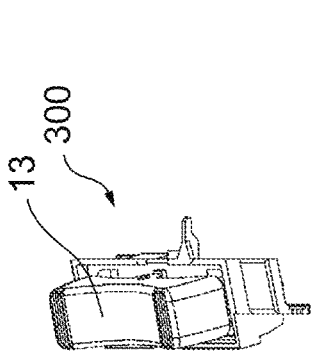
Figure 14B:
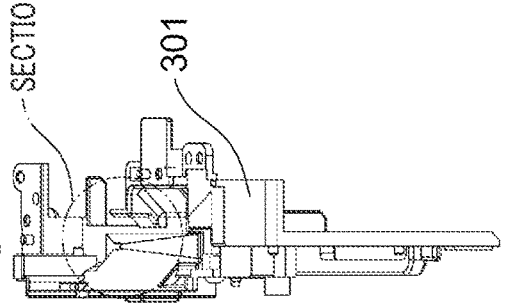
Figure 15A:
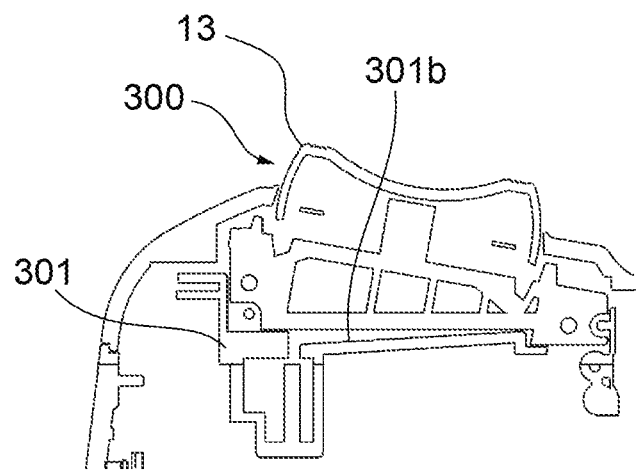
FIG. 15A and FIG. 15B are views showing sections in an E-E plane and a D-D plane in FIG. 1A.
Figure 15B:
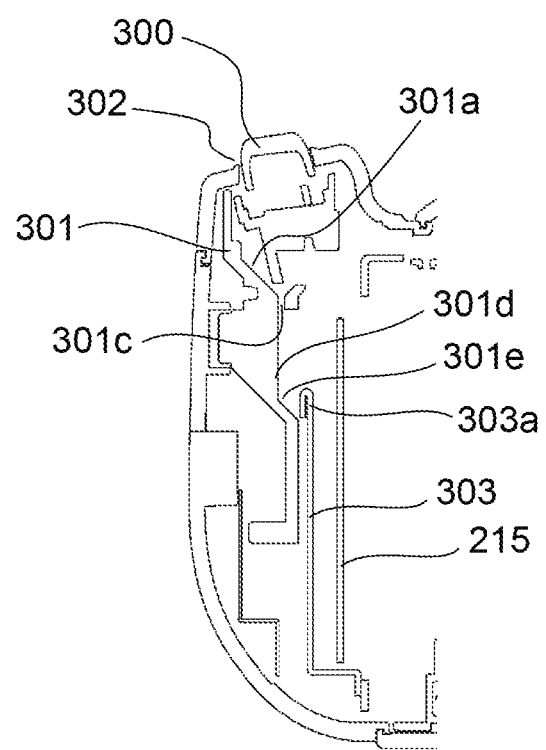

Next, the configuration of the zoom operation button 13 will be described. FIG. 12 is a perspective view showing the video camera 1 in a state where construction components around the zoom operation button 13 are exposed. FIG. 13 is a deployment perspective view showing circumference of the zoom operation button 13. FIG. 14A, FIG. 14B, FIG. 14C, and FIG. 14D are partial perspective views showing a zoom operation unit. FIG. 14E is an enlarged view of a B-section in FIG. 14B. FIG. 14F is an enlarged view of a C-section in FIG. 14D. FIG. 15A and FIG. 15B are views showing sections in an E-E plane and a D-D plane in FIG. 1A.

As shown in FIG. 12 through FIG. 15B, the zoom operation unit 300 includes the zoom operation button 13, a zoom unit holder 301, and a substrate heat dissipation member 303 (FIG. 13). The substrate heat dissipation member 303 is arranged at the side opposite to the lens unit 10 of the control substrate 215 and is connected to the lower-left heat dissipation member 201 with a plurality of fixing screws 304a, 304b, 304c, and 304d. An outside heat conduction rubber 305 is made from soft and deformable material. The outside heat conduction rubber 305 intervenes between an electrical component (not shown) and the substrate heat dissipation member 303. The electrical component is a heating source and is implemented to the control substrate 215 at the side opposite to the lens unit 10. The outside heat conduction rubber 305 is deformed according to the shape of the electrical component so as to adhere to the both. The outside heat conduction rubber 305 transfers the heat generated by the electrical component to the substrate heat dissipation member 303.

When detecting that a front or back pressure part of the zoom operation button 13 is pushed in the internal direction, the video camera 1 changes the capturing field angle of the lens unit 10 to a telephoto side or a wide-angle side. A gap 302 (FIG. 15B) is provided so that the pressure part of the zoom operation button 13 may not contact the appearance cover at the time of the push operation of the pressure part. When a waterdrop invades from the gap 302, the waterdrop flows to the bottom side along a downwardly slant face 301a. Since the bottom base of the downwardly slant face 301a is a backwardly slant face 301b (FIG. 14E, FIG. 15A) that is inclined toward the back side of the video camera 1, the waterdrop flows the back side of the video camera 1.

A bottom opening 301c (FIG. 15B) penetrated inside the video camera 1 is provided in the back end of the backwardly slant face 301b. The waterdrop flows inside the video camera 1 through the bottom opening 301c. A guide rib 301d is formed at an exit of the bottom opening 301c that is continuous to the bottom opening 301c. A guide slant face 301e is formed under the guide rib 301d. The waterdrop flows along the guide rib 301d and guide slant face 301e, and further flows inside the video camera 1. Near the end position of the guide slant face 301e, the substrate heat dissipation member 303 is close to the zoom unit holder 301. Accordingly, even if a waterdrop falls toward the control substrate 215 from the guide slant face 301e, the waterdrop falls to the surface of the substrate heat dissipation member 303 and does not directly fall to the control substrate 215.

The upper end of the substrate heat dissipation member 303 is bent by 180 degrees toward the zoom unit holder 301 to form a bent portion 303a (FIG. 15B). The bent portion 303a prevents a waterdrop from flowing to the control substrate 215 from the upper end of the substrate heat dissipation member 303. Even if a waterdrop flows along the lower part of the guide slant face 301e or the surface of the substrate heat dissipation member 303 and further flows to the bottom, the waterdrop falls to a bottom inner wall of the appearance cover and does not fall to the control substrate 215.

Next, the configuration of the circumference of the power source of the video camera 1 will be described in detail. As shown in FIG. 10A and FIG. 10B, a battery case unit 218 is provided in the back part of the video camera 1. A battery terminal 219 is provided inside the battery case unit 218. The battery case unit 218 is a part of the back face of the video camera 1. When the battery 22 is attached, the battery 22 is electrically connected to the battery terminal 219.

The battery terminal 219 is implemented to a power source flexible wiring board 250 shown in FIG. 10B with soldering. The power source flexible wiring board 250 is connected to the power source connector 215c (FIG. 10A) of the control substrate 215 and is electrically connected to the control substrate 215. The external power source substrate 33 is arranged at the back upper side of the video camera 1. The power input terminal 31 and remote operation terminal 32 are implemented on the external power source substrate 33. The power source wire 220 is connected to the external power source substrate 33. When the power source wire 220 is connected to a connector 215d of the control substrate 215, the power input terminal 31 is electrically connected to the control substrate 215. The length of the power source wire 220 varies according to convenience for manufacturing.

The battery case unit 218 is provided with a back rib 218b extended backward and a side rib 218c extended leftward. The back rib 218b is prolonged toward the back side of the video camera 1. The battery case unit 218 is provided with spaced ribs 218g and 218h formed to be extended to the left side in a direction approximately parallel to the both ends 218e and 218f of the power source flexible wiring board 250. The back rib 218b and side rib 218c are extended in the directions that are perpendicularly intersected mutually. There is a wire gap 218w corresponding to the outer diameter of the power source wire 220 between the ribs 218b and 218c. The power source wire 220 connected to the external power source substrate 33 is wired in a channel shape along with the back rib 218b and is wired through the wire gap 218w. After that, the power source wire 220 is subjected to an excess length process for absorbing individual variation of the length between the side lib 218c and the control substrate 215 and is connected to the connector 215d of the control substrate 215.

The power source flexible wiring board 250 and power source wire 220 are held by the back rib 218b and side rib 218c in this way. Since the power source wire 220 is wired while avoiding the power source flexible wiring board 250, radio interference due to contact between the power source flexible wiring board 250 and power source wire 220 and the mechanical disconnection due to nipping are avoided.

Next, the configuration and heat dissipation paths of the video camera 1 will be described. The heat of the image sensor 207 shown in FIG. 7 is transmitted to the sensor heat sink 211 through the heat conduction member 212 from the heat sink surface 206b of the image sensor substrate 206, and is transmitted to the upper-right heat dissipation member 200 and lower-left heat dissipation member 201 after that. As shown in FIG. 9B, the width of the right arm 211b of the sensor heat sink 211 is wider than the total width of the upper arm 211c and lower arm 211d. This can be described as follows from the viewpoint of the width of the heat conduction path from the central part 211a of the sensor heat sink 211 to the first heat dissipation section (heat dissipation members 200 and 201).

That is, the width of the heat conduction path between the central part 211a of the sensor heat sink 211 and the left face 201b is narrower than the width of the heat conduction path between the central part 211a of the sensor heat sink 211 and the right face 200b. Since the left face 201b is thermally coupled with the control substrate 215, the right arm 211b is far from the control substrate 215 as compared with the upper arm 211c and lower arm 21d. Accordingly, it is more preferable to transmit the heat transmitted from the image sensor substrate 206 to the right face 200b that is far from the control substrate 215 rather than to transmit to the left face 201b from the viewpoint of the heat dissipation efficiency. Accordingly, the widths of the heat conduction paths are set as mentioned above so that the heat transmitted from the image sensor substrate 206 will be easily transmitted to the right face 200b.

As shown in FIG. 7, the right arm 213b of the reinforcement holder 213 is provided with an upper projection 213f and a lower projection 213g that are projected towards the sensor heat sink 211. The upper projection 213f and lower projection 213g push the right arm 211b of the sensor heat sink 211 toward the upper-right heat dissipation member 200, which increases the heat conduction efficiency between the sensor heat sink 211 and the upper-right heat dissipation member 200.

Next, an idea to lengthen the heat conduction path from the left face 201b of the lower-left heat dissipation member 201 that is thermally coupled with the control substrate 215 to the sensor heat sink 211 will be described. As shown in FIG. 7 and FIG. 11B, an extended part 201e is extended from the left face 201b at the opposite side (back side) of the image pickup optical system in the direction of the optical axis 10b. The extended part 201e is extended upward and then extended frontward. An upper stationary part 201c is provided at the tip of the part extended frontward. Since the sensor heat sink 211 is fixed to the upper stationary part 201c, the extended part 201e becomes a heat conduction path from the left face 201b to the sensor heat sink 211.

Since the extended part 201e has a shape that is bent in the middle, the above-mentioned heat conduction path has one point at which the direction is reversed in the direction of the optical axis 10b. Thereby, the heat conduction path becomes long. The shape of the extended part 201e that lengthens the heat conduction path decreases a heat conduction amount between the left face 201b and sensor heat sink 211. Accordingly, while the heat generated in the sensor heat sink 211 is hard to be transmitted to the left face 201b, it becomes easy to be transmitted to the right face 200b that is the far side from the control substrate 215. Since the temperature of the lower-left heat dissipation member 201 has risen by heat generation of the electrical components implemented on the control substrate 215, the heat in the entire video camera 1 can be dissipated efficiently by transmitting the heat of the sensor heat sink 221 to the right face 200b as much as possible. The extended part 201e may have two or more points at which the direction is reversed from a viewpoint of lengthening the heat conduction path.

According to the embodiment, the first heat dissipation section (heat dissipation members 200 and 201) is fixed to the lens unit 10 so that the image pickup optical system will be surrounded by the four faces (200a, 200b, 201a, and 201b) approximately parallel to the optical axis 10b from the four sides. The lower-left heat dissipation member 201 that is thermally coupled with the control substrate 215 is fixed to the heat dissipation members 200 and 201. The heat conduction member 212 contacts the both of the image sensor substrate 206 and the sensor heat sink 211. Thereby, the heat generated in the image sensor substrate 206 or the control substrate 215 can be efficiently dissipated. Accordingly, it is not necessary to provide a fan like a conventional apparatus.

Moreover, the width of the heat conduction path between the central part 211a of the sensor heat sink 211 and the left face 201b is narrower than the width of the heat conduction path between the central part 211a of the sensor heat sink 211 and the right face 200b. Accordingly, the heat generated in the image sensor substrate 206 is easily transmitted to the right face 200b that is far from the control substrate 215 of the first heat dissipation section, which improves the heat dissipation efficiency.

Moreover, the heat conduction member 212 consists of the elastic member 212a and copper foil sheet 212d. The heat conduction member 212 are adhered to the sensor heat sink 211 using the exposure areas 212i and 212j as an adhesive surface on which the copper foil sheet 212d is not pasted. Moreover, a part (212k) of the copper foil sheet 212d contacts the sensor heat sink 211. Thereby, the heat conduction member 212 obtains a fixing function and a heat conduction function with an easy configuration. Moreover, since the exposure areas 212i and 212j are connected to all the surfaces connected with the two principal planes of the elastic member 212a, the heat conduction member 212 is stably fixed to the sensor heat sink 211.

Moreover, since the heat conduction path of the extended part 201e has the point at which the direction is reversed in the direction of the optical axis 10b in order to lengthen the heat conduction path, the heat generated in the sensor heat sink 211 is easily transmitted to the right face 200b that is far from the control substrate 215.

Moreover, the reinforcement holder 213 is tightened to the sensor heat sink 211 in the state overlapping with the sensor heat sink 211 when viewed in the direction of the optical axis 10b, and the both in the united state are fixed to the first heat dissipation section (heat dissipation members 200 and 201). Thereby, the reinforcement holder 213 reinforces the sensor heat sink 211 and obtains the reinforcement effect for the first heat dissipation section. Furthermore, the part (extended part 213a) of the reinforcement holder 213 extends to the outside of the outline of the image sensor substrate 206 and to the outside of the outline of the lens unit 10 when viewed in the direction of the optical axis 10b. Thereby, the image sensor substrate 206 and the back (the part near the part where the image sensor substrate 206 is attached, particularly) of the lens unit 10 are protected from external force.

Incidentally, the sensor heat sink 211 is fixed to the two faces (200b and 201b) that are mutually opposite from among the four surfaces (200a, 200b, 201a, and 201b) of the first heat dissipation section. This reinforces the first heat dissipation section and increases the rigidity of connection between the first heat dissipation section and second heat dissipation section. However, the two faces that are mutually opposite may be the upper face 200a and the lower face 201a. It should be noted that the sensor heat sink 211 may be fixed to three or more faces from among the four faces from a viewpoint of improving the reinforcement effect and rigidity.

The first heat dissipation section consists of the two members including the upper-right heat dissipation member 200 and lower-left heat dissipation member 201. However, the first heat dissipation section may consist of one member or may consist of three or more members that are connected and fixed as long as it has four faces (walls) approximately parallel to the optical axis 10b.

Next, a second embodiment of the present invention will be described. In the second embodiment of the present invention, the configuration of the heat conduction member differs from the first embodiment, and the other configurations are identical.

FIG. 16A, FIG. 16B, and FIG. 16C are perspective views showing a heat conduction member 500 of a video camera in the second embodiment of the present invention. The heat conduction member 500 consists of an elastic member 212a and a copper foil sheet (heat conduction sheet) 500a that wraps the elastic member 212a. The configuration of the elastic member 212a is identical to what is shown in FIG. 8A. The copper foil sheet 500a differs in shape from the copper foil sheet 212d. The copper foil sheet 500a is a thin cross shaped sheet and copper foil is exposed to the surface. The copper foil sheet 500a has a plurality of arms 500b extended in the cross directions, a plurality of notches 500c, and a plurality of chamfers 500d.

After the elastic member 212a is pasted on the central part of the copper foil sheet 500a with a first double-sided tape 212b, the copper foil sheet 500a is turned up so as to wrap the elastic member 212a using the notches 500c as indices and is pasted and fixed to a second double-sided tape 212c. Thereby, the copper foil sheet 500a forms heat conduction paths 500e (FIG. 16B) between front and back surfaces of the heat conduction member 500. Although the exposure areas 212i and 212j are formed in the first embodiment, cross-shaped exposure areas 500f and 500g are formed in the second embodiment. The exposure areas 500g are formed between the adjacent chamfers 500d. The exposure areas 500g are formed toward the four corners of the elastic member 212a from the center of the exposure area 500f. The heat conduction member 500 is pasted on the sensor heat sink 211 using the second double-sided tape 212c that is exposed in the exposure areas 500g and the exposure area 500f.

The entire exposure area that consists of the exposure areas 500f and 500g is connected to all the surfaces connected to the two principal planes of the elastic member 212a. As with the first embodiment, the heat conduction member 500 is compressed and the copper foil surface adheres to the heat sink surface 206b and sensor heat sink 211. Since the exposure areas 500g are formed toward the four corners from the center, the heat conduction member 500 is stably pasted.

Moreover, the elastic member 212a is compressed as a whole and adheres certainly without giving an excessive load to the image sensor substrate 206. The other effects of the compressive deformation of the elastic member 212a are identical to that in the first embodiment.

The second embodiment obtains the same effect as the first embodiment about the efficient dissipation of the heat generated in the image sensor substrate 206 or the control substrate 215.

OTHER EMBODIMENTS

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-241271, filed Dec. 25, 2018, which is hereby incorporated by reference herein in its entirety.

What is claimed is:

1. An image pickup apparatus comprising:
a lens unit that has an image pickup optical system;
an image sensor that outputs an electrical signal corresponding to an object image formed through the image pickup optical system;
a sensor substrate on which the image sensor is implemented;
a first heat dissipation section that has four faces approximately parallel to an optical axis of the image pickup optical system and is fixed to the lens unit so that the four faces will surround the image pickup optical system from four sides;
a control substrate that is thermally coupled with the first heat dissipation section;
a second heat dissipation section that is arranged at a side opposite to the image pickup optical system in a direction of the optical axis with respect to the sensor substrate and is fixed to the first heat dissipation section; and
a heat conduction member that is arranged between the sensor substrate and the second heat dissipation section in the direction of the optical axis so as to contact both of the sensor substrate and the second heat dissipation section.

2. The image pickup apparatus according to claim 1, wherein the sensor substrate has a heat sink surface at a side opposite to a side to which the image sensor is implemented, and
wherein the heat conduction member is in surface contact with the heat sink surface.

3. The image pickup apparatus according to claim 1, wherein the heat conduction member is in surface contact with a surface of the second heat dissipation section that is approximately perpendicular to the optical axis.

4. The image pickup apparatus according to claim 1, wherein the second heat dissipation section is fixed to at least two faces that are mutually opposite from among the four faces of the first heat dissipation section.

5. The image pickup apparatus according to claim 4, wherein the second heat dissipation section is fixed to a thermally coupled face with the control substrate and a face opposite to the thermally coupled face from among the four faces of the first heat dissipation section, and
wherein a width of a heat conduction path between the thermally coupled face of the first heat dissipation section and the second heat dissipation section is narrower than a width of a heat conduction path between the surface opposite to the thermally coupled face of the first heat dissipation section and the second heat dissipation section.

6. The image pickup apparatus according to claim 1, wherein the heat conduction member has elasticity.

7. The image pickup apparatus according to claim 6, wherein the heat conduction member intervenes between the sensor substrate and the second heat dissipation section in a compression state corresponding to tilt of the image sensor to the optical axis due to tilt adjustment of the image sensor.

8. The image pickup apparatus according to claim 1, wherein the heat conduction member consists of an elastic member that has an adhesive surface and a heat conduction sheet that wraps the elastic member,
wherein the heat conduction sheet is pasted on the adhesive surface of the elastic member, and
wherein an exposure area that the heat conduction sheet is not pasted and exposes the adhesive surface is pasted on the second heat dissipation section and a part of the heat conduction sheet is in contact with the second heat dissipation section.

9. The image pickup apparatus according to claim 8, wherein the elastic member is approximately rectangular when viewed in the direction of the optical axis and has two principal planes approximately parallel to the optical axis;
wherein the exposure area is formed at least one of the two principal planes, and
wherein the exposure area is connected to all the surfaces connected to the two principal planes of the elastic member.

10. The image pickup apparatus according to claim 1, wherein an extended part is extended from a thermally coupled face with the control substrate among the four faces of the first heat dissipation section toward the side opposite to the image pickup optical system in the direction of the optical axis,
wherein the second heat dissipation section is fixed to a stationary part provided in the extended part, and
wherein there is at least one point at which the direction is reversed in the direction of the optical axis in a heat conduction path from the thermally coupled face with the control substrate of the first heat dissipation section to the second heat dissipation section through the extended part.

11. The image pickup apparatus according to claim 1, further comprising a reinforcement member that is arranged at a side opposite to the image pickup optical system in the direction of the optical axis with respect to the second heat dissipation section,
wherein the reinforcement member is fixed to the first heat dissipation section in a state overlapping with the second heat dissipation section when viewed in the direction of the optical axis.

12. The image pickup apparatus according to claim 11, wherein the reinforcement member is fixed to the second heat dissipation section and is fixed to the first heat dissipation section in a state united with the second heat dissipation section.

13. The image pickup apparatus according to claim 11, wherein a part of the reinforcement member is extended to an outside of an outline of the sensor substrate when viewed in the direction of the optical axis.

* * * * *